United States Patent [19]

Williamson et al.

[11] Patent Number: 4,461,036

[45] Date of Patent: Jul. 17, 1984

[54] PROCESSOR CONTROLLED SCANNING RADIO RECEIVER

[75] Inventors: Warren L. Williamson; George H. Fathauer, both of Mesa, Ariz.; Cecil E. Mathis, Indianapolis, Ind.

[73] Assignee: Masco Corporation of Indiana, Cumberland, Ind.

[21] Appl. No.: 200,537

[22] Filed: Oct. 24, 1980

Related U.S. Application Data

[63] Continuation of Ser. No. 000,905, Jan. 4, 1979, abandoned, and a continuation-in-part of Ser. No. 847,497, Nov. 1, 1977, abandoned.

[51] Int. Cl.³ .............................................. H04B 1/26
[52] U.S. Cl. .................................. 455/165; 455/183; 455/185; 455/186
[58] Field of Search ............... 455/154, 156, 161, 164, 455/165, 166, 169, 174, 177, 179, 183, 185, 186, 221, 218; 358/191.1, 192.1, 193.1

[56] References Cited

U.S. PATENT DOCUMENTS

| | | | |
|---|---|---|---|
| 3,961,261 | 6/1976 | Pflasterer | 455/194 |
| 3,962,644 | 6/1976 | Baker | 455/165 |
| 4,000,468 | 12/1976 | Brown | 455/165 |
| 4,027,251 | 5/1977 | Fathauer | 455/165 |
| 4,081,752 | 3/1978 | Sumi | 455/166 |
| 4,092,594 | 5/1978 | Baker | 455/265 |
| 4,114,103 | 9/1978 | Pflasterer | 455/161 |

Primary Examiner—Tommy P. Chin
Attorney, Agent, or Firm—Leon E. Redman

[57] ABSTRACT

There is disclosed a processor controlled scanning radio receiver which employs a microprocessor controller to operate in various modes. One mode of operation is a search/recall mode wherein frequencies located during an automatic search operation are stored in a recirculating storage device for later user recall. The recirculating storage device is also employed to store frequencies or "birdies" to be locked out during a search operation. The channels to be scanned are stored in an electrically alterable read only memory in which the channels are arranged in five banks having ten channels per bank. A keyboard is included via which a user may select or deselect any one or more banks for the scanning operation.

23 Claims, 7 Drawing Figures

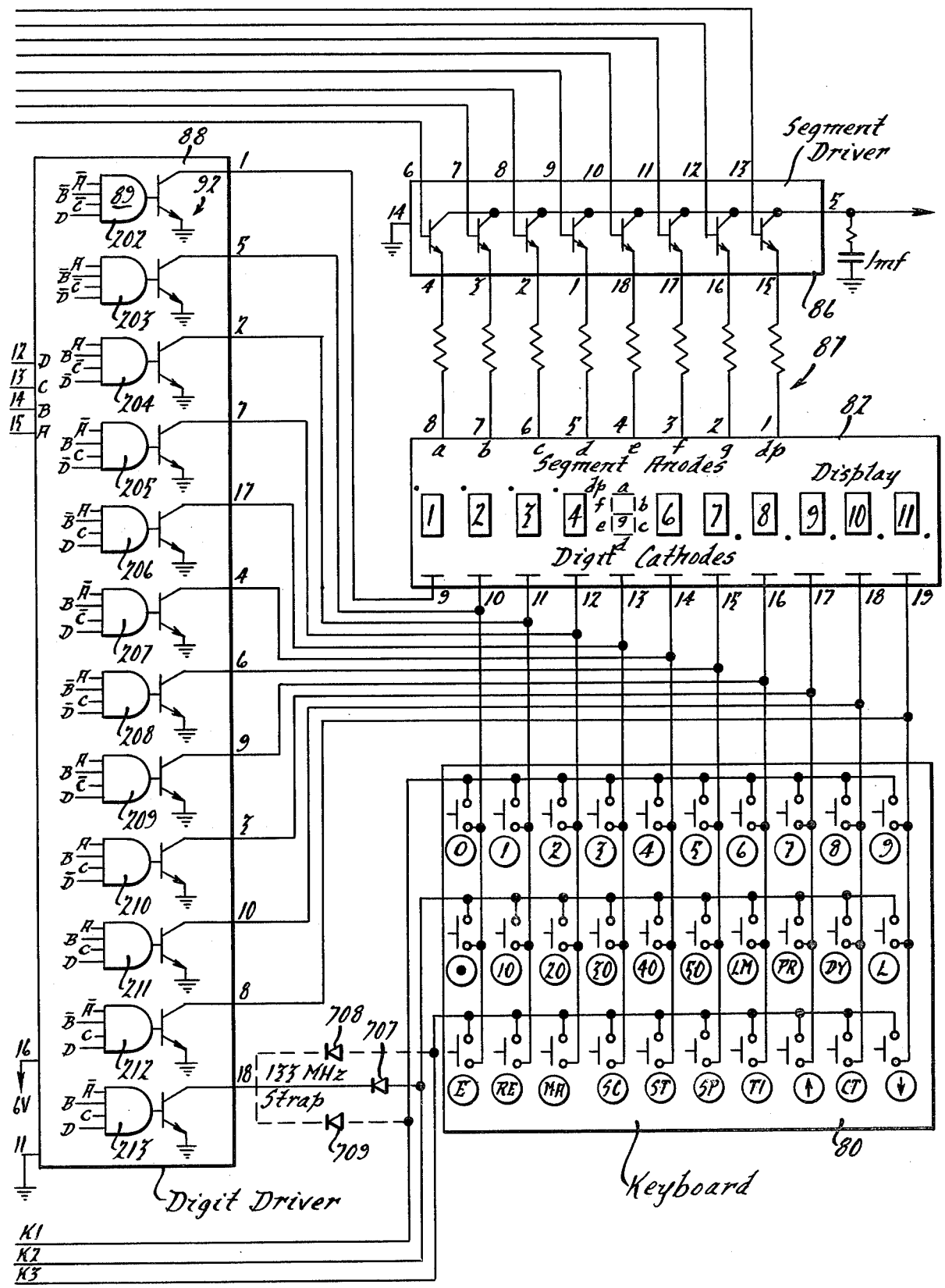

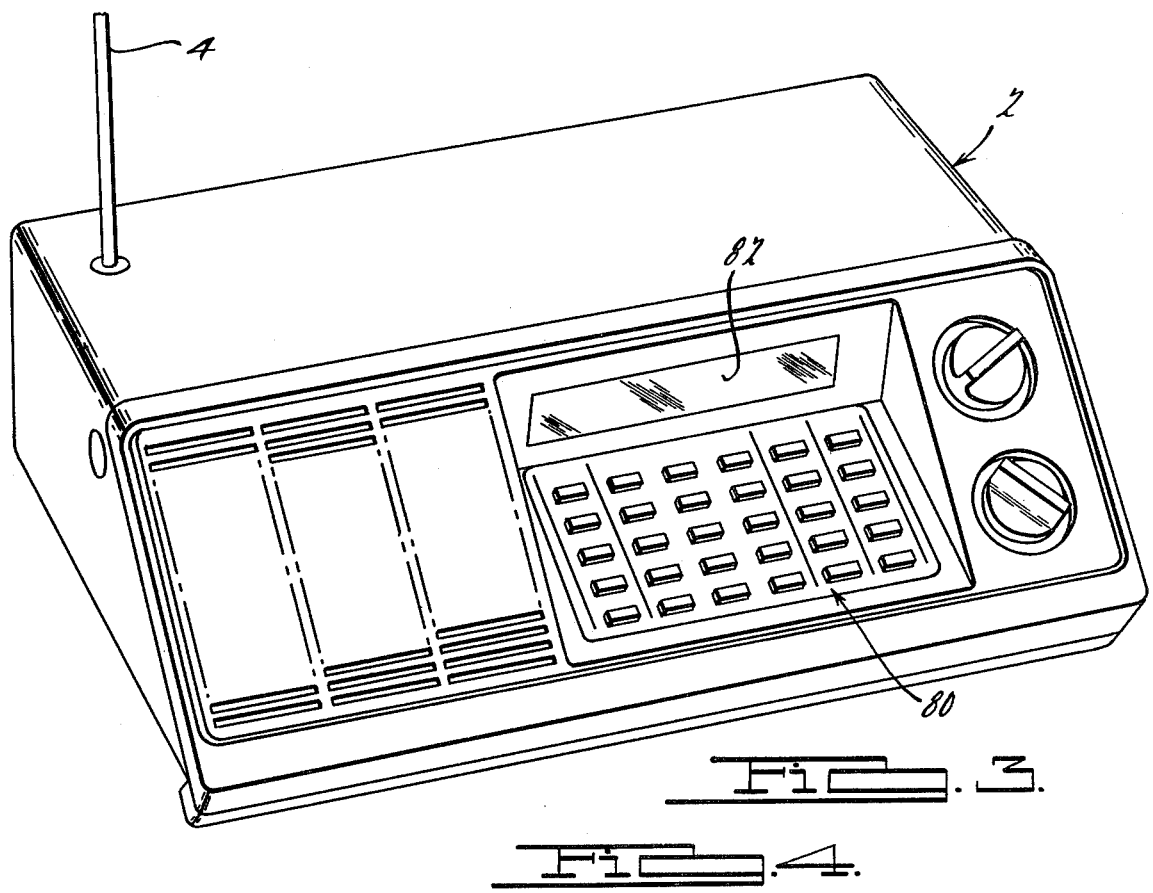
FIG. 3.
FIG. 4.
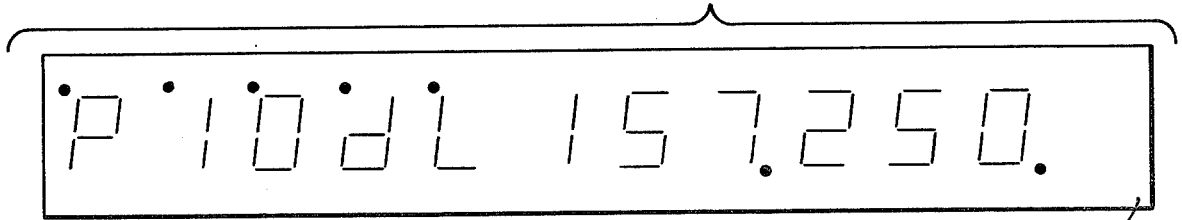

PROCESSOR CONTROLLED SCANNING RADIO RECEIVER

CROSS-REFERENCE TO RELATED APPLICATION

This is a continuation of application Ser. No. 000,905, filed Jan. 4, 1979.

This is a continuation-in-part of co-pending U.S. patent application Ser. No. 847,497, filed on Nov. 1, 1977, entitled Processor Controlled Scanning Radio Receiver Having Search Between Limits by the same inventive entity and of common ownership herewith.

BACKGROUND OF THE INVENTION

This invention relates to scanning radio receivers and, more particularly, to scanning radio receivers particularly useful on the frequencies assigned to the Public Safety Radio Services.

Scanning radio receivers are well known in the prior art and have found particular utility for the reception of radio signals on the frequencies assigned by the United States Federal Communications Commission to the Public Safety Radio Services. In the past, many such radio receivers used crystals as the tuning element to provide the necessary local oscillator signals and required the presence of one crystal for each frequency the receiver was capable of tuning. Examples of such receivers are those shown in U.S. Pat. Nos. 3,531,724 to G. H. Fathauer, 3,665,318 to S. J. Hoffman, et al., 3,714,585 to R. C. Koch, 3,725,788 to G. H. Fathauer, 3,794,925 to K. Imazeki, 3,801,914 to K. Imazeki, 3,821,651 to G. H. Fathauer, et al., 3,873,924 to G. H. Fathauer, 3,883,808 to J. E. Boone, 3,824,475 to P. W. Pflasterer, and 3,987,400 to G. H. Fathauer. Recently, scanning radio receivers using frequency synthesizing techniques have been provided which eliminated the need for a large number of crystals in radio receivers capable of being tuned to a large number of frequencies. Such receivers are shown in U.S. Pat. Nos. 3,937,972 to S. C. Snell, 3,961,261 to P. W. Pflasterer, 4,000,468 to J. R. Brown, et al., 4,027,251 to G. H. Fathauer, et al., 4,100,497 to G. H. Fathauer, et al., 4,114,103 to P. W. Pflasterer, and 4,123,715 to G. H. Fathauer. There has also been provided by the prior art scanning radio receivers using frequency synthesizing techniques wherein the frequency synthesizing circuitry was controlled by the operation of a processing means such as a microprocessor. Exemplary radio receivers of this last-mentioned type are disclosed in U.S. Pat. Nos. 3,962,644 to W. Baker and 4,092,594 to W. Baker.

Scanning radio receivers making use of microprocessors to control the frequency synthesizing circuitry have many advantages over the scanning radio receivers known prior thereto. One of the foremost of these advantages is the very high degree of flexibility in control which may be included in such a radio. An example of the practical benefits which may be obtained from such a radio is the "search" mode of operation shown in the aforementioned U.S. Pat. Nos. 3,962,644 and 4,092,594 by which the radio may be successively and automatically tuned to adjacent ones of the Public Safety Radio Service frequencies until the receiver arrives at a frequency upon which a signal is received. Such operation was impractical with scanning radio receivers known prior thereto. In the case of crystal receivers, it would have normally required the use of a separate crystal for each frequency while in the case of a synthesized receiver using more conventional circuit techniques, it would have required the manual entry of some type of frequency information or code for each frequency.

One of the primary uses of a search mode of operation is to permit the user to search for and discover the location of active frequencies in his geographic area. This can be a rather time consuming process because of the intermittent nature of the signals which occur on most of the Public Safety Radio Service frequencies.

A scanning radio receiver recently has been invented that includes a search mode of operation in which the receiver searches repetitively and sequentially all the allocated frequencies located between an upper frequency limit and a lower frequency limit, both of which limits may be selected by the user. This receiver is fully described in copending U.S. patent application Ser. Nos. 847,497 and 847,566 both filed on Nov. 1, 1977. A keyboard is employed for inputting the frequency limits to this receiver.

This enables a user to vary the number and range of search frequencies to search a range of frequencies tailored to his interest while increasing the probability of locating an active frequency. This receiver also includes means for automatically entering a frequency located during the search mode of operation into a corresponding one of the receiver channels for subsequent channel scanning operations. However, to achieve maximum benefit from this search mode of operation the user must carefully listen for the presence of audio signals on a frequency located during the search operation to decide whether or not this frequency should be entered in a channel for subsequent scanning operations. This can be a tedious process, again due to the intermittent nature of the occurrence of frequencies in the Public Radio Service bands.

A problem often encountered in the search operation, especially when the search limits programmed by the user span a wide frequency range, is that the search stops on frequencies that unsquelch the receiver in response to spurious noise signals commonly referred to as "birdies". This problem can be reduced by the user selecting search limits between which "birdies" do not occur. However, the user may not know exactly the frequencies on which birdies occur or the user may desire to search a broad frequency range that includes one or more "birdie" frequencies. It is desirable that such "birdie" frequencies be locked out so they do not interfere with search operations.

Since the receiver of the present invention is capable of being programmed with up to fifty of the myriad frequencies available in the Public Services bands it is desirable for the receiver to provide an indication of the number of times a signal is received on a programmed channel. This would benefit the user by enabling him to evaluate his selection of programmed frequencies so that relatively inactive channels may be reprogrammed with more active frequencies.

It is an object of this invention to provide a scanning radio receiver having a search mode of operation wherein the user may easily and simply take full advantage of all the capabilities of that search mode.

It is another object of this invention to provide a scanning radio receiver having a search mode of operation having means whereby certain frequencies can be locked out of the search operation.

It is another object of this invention to provide a scanning radio receiver having a store mode of operation wherein a plurality of active frequencies found by the receiver are automatically entered into a receiver store for subsequent recall by a user.

It is another object of this invention to provide a scanning radio receiver having a recall mode of operation wherein frequencies stored during a store mode of operation may be subsequently recalled by a user.

It is another object of this invention to provide a scanning radio receiver having a recall mode of operation wherein a frequency recalled by a user may be automatically entered into a receiver as a frequency corresponding to one of the receiver channels to be subsequently scanned during a channel scanning operation.

It is another object of this invention to provide an indication of the number of times that a signal was received on a radio receiver channel during a scan mode of operation.

It is yet another object of this invention to reduce audio noise and distortion in synthesized scanning radio receivers.

Further and additional objects of this invention will be apparent from the subsequent description, the appended claims, and the attached drawing.

Some of the subject matter disclosed but not claimed herein forms the subject matter of a patent application of A. R. Kahn and S. E. Chappell entitled SCANNING RADIO RECEIVER HAVING IMPROVED FREQUENCY SYNTHESIZER filed of even data herewith and assigned to the assignee of this application.

DESCRIPTION OF THE DRAWINGS

FIGS. 2a, 2b, and 2c comprise a drawing partly in block form and partly in schematic form illustrating in greater detail the microprocessor control section of the receiver shown in FIGS. 1a and 1b.

FIG. 3 is an isometric view of a cabinet in which the scanning radio receiver of the present invention may conveniently be housed.

FIG. 4 is an enlarged view of the display and keyboard portions of the receiver shown in FIG. 3.

DESCRIPTION OF THE PREFERRED EMBODIMENT

Figure 1A:
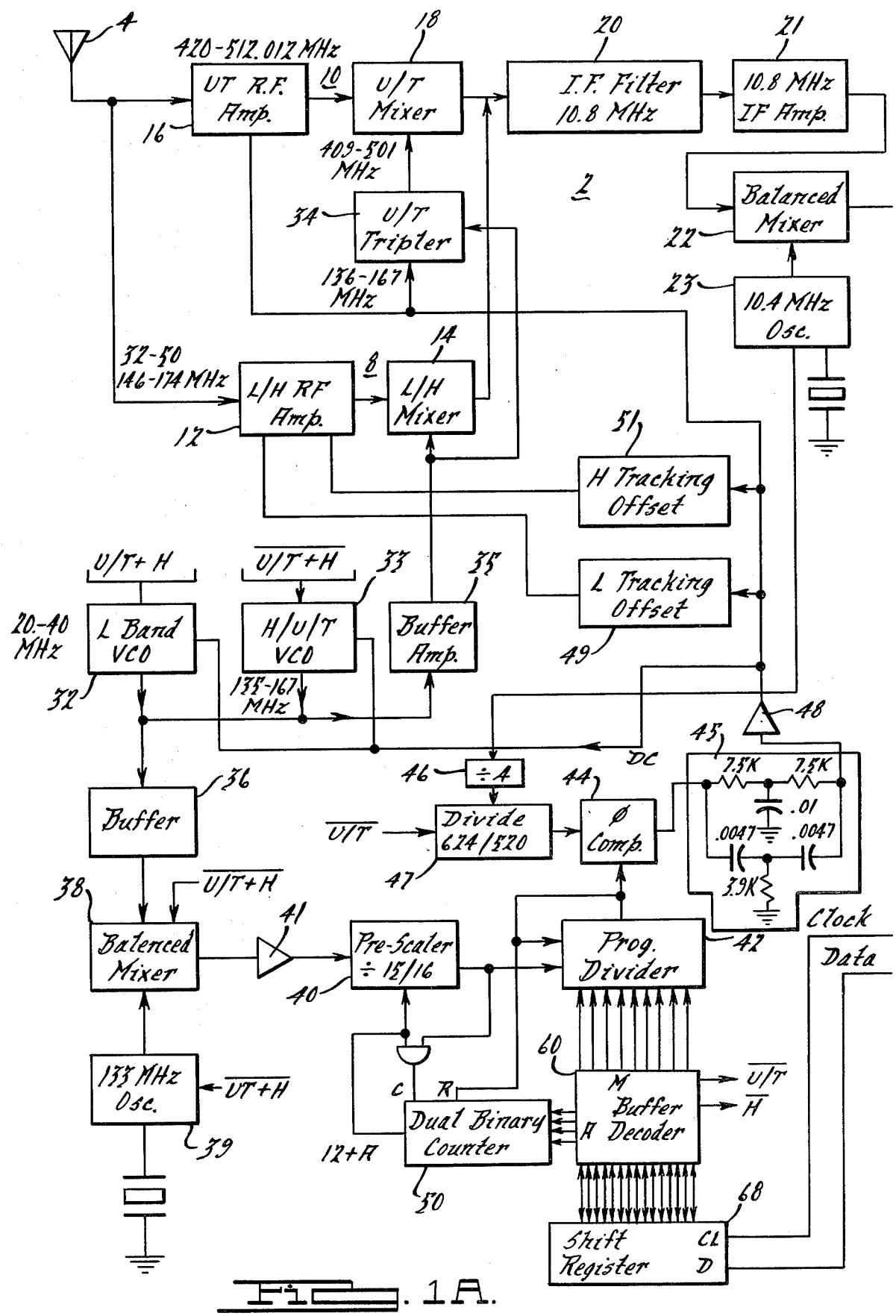
FIGS. 1a and 1b comprise a drawing partly in block form and partly in schematic form of a scanning radio receiver of this invention.

This is disclosed in the drawing a radio receiver including one embodiment of this invention. It will be understood, of course, that this invention is of much wider applicability than the single embodiment disclosed and that the invention is not to be limited to that embodiment.

The receiver 2 of the drawing is a scanning radio receiver for reception of the radio frequencies designated by the United States Federal Communications Commission as being available for assignment to the Public Safety Radio Services. That designation appears at Part 89, Title 47, Code of Federal Regulations. The designated frequencies are commonly referred to as falling within four separate radio frequency bands, the "low" or "L" band including the designated frequencies falling within the range of approximately 30-50 MHz. (which frequencies all occur at multiples of 5 kHz.), the "high" or "H" band including the designated frequencies falling within the range of approximately 150-174 MHz. (which frequencies all occur at multiples of 5 kHz.), the "ultra-high frequency" or "U" band including the designated frequencies falling within the range of approximately 450-470 MHz. (which frequencies all occur at multiples of 12.5 kHz.), and the "television" or "T" band including the designated frequencies falling within the range of approximately 470-512 MHz. (which frequencies all occur at multiples of 12.5 kHz.) Frequency modulation is used on the signals at the designated frequencies. It is desirable for a receiver useful for the Public Safety Radio Services to be capable of receiving signals at each of the assigned frequencies in each of the L, H, U and T bands. Additionally, the receiver 2 is also capable of receiving signals in the 146-148 MHz. portions of the 2 Meter Amateur Radio band, the 148-150 MHz. frequency range, and the 420-450 MHz. band assigned for use by agencies of the U.S. Government. For the purposes of the subsequent description, it will be assumed that the H band includes frequencies in the range of 146-150 MHz. and the U band includes frequencies in the range of 420-450 MHz.

The receiver 2 is capable of receiving radio signals on any of the frequencies in the L, H, U and T bands and is capable of scanning between any number up to fifty of preselected ones of those frequencies arranged in any order. The receiver has fifty channels of operation, and each channel may be set to tune the receiver to any one of the designated frequencies. The receiver is such that in one mode of operation referred to as the "scan" mode it will tune to one of the preselected frequencies and, if there is a signal at that frequency, remain tuned thereto. If there is no signal at that frequency, or a signal present is terminated, the receiver will successively tune itself to all the preselected frequencies until one is reached having a signal thereon. It will stop on the first frequency it reaches having a signal and remain tuned thereto until that signal terminates, at which time the receiver will recommence the described scanning operation. The receiver is also such that in another mode of operation referred to as the "search" mode it will perform a function similar to that of the scan mode except that while operating on any selected channel it will successively tune to all the designated frequencies within a frequency range selected by the user. In a "manual" mode, the receiver may be set to operate on any one of the fifty channels.

In a mode of operation referred to as the "search/store" mode the receiver will automatically store the active frequencies located during the "search" operation in a memory for later recall. The receiver will retrieve and display stored frequencies, one at a time, during the "search/recall" mode, and tune the receiver thereto. In a mode of operation referred to as the "Count" mode, the receiver may be set to display the number of transmissions, up to 99, received on any one of the fifty channels during the "scan" operation.

As shown in FIG. 1, the receiver 2 includes an antenna 4 coupled to two radio frequency sections 8 and 10. Radio frequency section 8 is operative in the L and H bands and comprises a radio frequency amplifier 12 and a first L and H band mixer 14 while radio frequency section 10 is operative in the U and T bands and comprises a radio frequency amplifier 16 and a first U and T band mixer 18. Radio frequency amplifiers 12 and 16 include variable frequency filter sections coupled to tracking inputs of the respective circuits which are effective to tune the circuits in response to the signals present at the respective tracking inputs.

The outputs of the mixers 14 and 18 are both coupled to a 10.8 MHz. intermediate frequency filter 20 which comprises a four pole crystal filter. The 10.8 intermediate frequency filter 20 is connected to a 10.8 MHz. amplifier 21 which, in turn, is coupled to one input of a balanced mixer 22. Another input of mixer 22 is coupled to the output of a 10.4 MHz. crystal oscillator 23. The output of mixer 22 is coupled through a 400 kHz. intermediate frequency filter 24 to a 400 kHz. I.F. amplitude limiter-amplifier and f.m. demodulator 25 (FIG. 1b), the output of which is amplified by an audio amplifier 26 having a volume control circuit 27 coupled to its input. The output of this audio amplifier 26 is used to drive a loudspeaker 28.

The output of limiter-amplifier and demodulator 25 is also coupled to a squelch circuit 30. Circuit 30 includes an output labeled SQ which is at logic level 0 when the receiver is tuned to a frequency having a signal thereon above the receiver squelch level which it is desired to receive and which otherwise is at logic level 1. (In this description, a positive logic convention will be assumed with a logic level 1 corresponding to a positive potential and logic level 0 corresponding to a ground level potential.)

The squelch circuit 30 is driven by the demodulated output of the 400 kHz. I.F. amplifier and detector circuit 25 and is effective to squelch the audio output of the receiver 2 in response to either one of two conditions: (i) The presence of excess high frequency noise (i.e., signals within a passband centered at approximately 8 kHz. and 1–3 kHz. wide) in the audio signal indicating that the receiver is tuned to a frequency with a weak or no signal, or (ii) The receiver being mistuned so that the received signal is not located in the center of the I.F. passband. The squelch circuit 30 includes a noise amplifier and detector circuit 54, a window detector circuit 56 and an audio squelch control circuit 58.

For a better understanding of the detailed structure and operation of squelch circuit 30 which in itself does not constitute a significant part of the present invention please refer to U.S. patent application Ser. N. 847,566, filed Nov. 1, 1977, pages 35 through 45, which hereby is incorporated by reference.

It should be noted that the squelch circuit 30 will thus prevent the receiver 2 from responding to a signal to which it is mistuned. This feature is especially desirable when the receiver is being used in the search and search/store modes described above and it is scanning successively located designated frequencies; it prevents the receiver from stopping the search operation while it is mistuned and also from storing mistuned frequencies. In particular, and dependent in part on the selectivity of the receiver and the bandwidth of the signals being received, when the receiver is being successively tuned to adjacent frequencies and is approaching a frequency on which a signal exists, a strong audio signal with little noise may be generated before that signal is in the center of the passband of the intermediate frequency amplifiers. In the absence of squelch circuit 30 and with use of a squelch system that responds only to high frequency noise in the audio signal, the receiver might well respond to the signal prior to its being tuned to place the signal in the center of the passband. Further, the squelch circuit 30 will also prevent the receiver from responding in the scan mode to signals which are closely adjacent to the frequency assigned to that channel rather than frequencies at that channel. The receiver here disclosed is operative in the search mode to successively tune to frequencies at 10 KHz. intervals in the L band and 5 KHz. in the H band, and at 25 kHz. intervals in the U and T bands, with the T band offset by 12.5 KHz., intervals significantly smaller than the spacing between adjacent designated frequencies in the L and H bands, and the described squelch circuit is particularly advantageous in such receivers. The squelch circuit described also aids in reducing the tendency of the receiver to respond to spurious signals resulting from interference or "birdies" generated within the receiver.

A novel aspect of the present invention includes the priority mute circuit 31 (FIG. 1b) connected between the 400 KHz I.F. amplifier and detector 25 and the volume control circuit 27 associated with the audio amplifier 26 of the receiver. Prior scanners that employed a priority feature were characterized by an unpleasant clicking sound that resulted from the receiver becoming unsquelched on each sample of a priority channel. The priority mute circuit 31 of the present invention overcomes this undesirable and annoying noise problem in the priority mode of operation. This priority mute circuit comprises a priority mute transistor 59 having its base electrode coupled through a 22 K resistor 57 to one of the outputs of the hex latches 61 to receive a priority mute control signal from the microprocessor 84. The priority mute transistor is an NPN transistor whose emitter is coupled between the 400 KHz I.F. amplifier and detector circuit 25 and the input to the volume control circuit 27. Its collector electrode is grounded. When the receiver operates in the priority mode of operation the processor 84 samples channel 1 for the presence of a signal at least once every two seconds. When this priority sample occurs the processor also outputs via the hex latch 61 a priority mute control signal which turns on the priority mute transistor 59 to maintain the audio squelch during the sample period. This prevents the audio amplifier 26 from becoming unsquelched during the priority sample and avoids the annoying clicking sound that otherwise may be present.

The local oscillator signals for mixers 14 and 18 are supplied from voltage controlled oscillators (VCO) 32 and 33. VCO 32 has a frequency range of operation of 19.2–30.2 MHz. VCO 33 has a frequency range of operation of 135.0–167.2 MHz. The range of operation is controlled by the signal present at a control input common to the two VCO's. The H/U/T band VCO 33 is enabled by a logic level 0 signal at the control input which causes it to operate in the upper frequency range and a logic level 1 signal at the control input causes the L band VCO 32 to operate in the lower frequency range. The outputs of VCO 32 and VCO 33 are coupled through a buffer amplifier 35 to an input of L and H band mixer 14 and through a frequency tripler 34 to an input of U and T band mixer 18. VCO 32 and VCO 33 each includes a tracking voltage input and the potential present at that input is effective to control the VCO frequency of operation within the ranges previously stated. A phase locked loop circuit is used to generate the tracking voltage as will now be explained.

The common output of VCO 32 and VCO 33 is applied through a buffer 36 to one input of a double balanced mixer circuit 38 which is manufactured and made available under industry designation TL 442CN. The normally active double balanced mixer circuit 38 is constructed to respond to a logic level 1 signal, indicating operation in the low band, applied to a control input thereof. The response of the mixer 38 to this signal is to become unbalanced and merely operates as a buffer which only passes the VCO output. When a logic level 0 signal is applied to the control input it operates as an active double balanced mixer. If operation is in the H, U or T bands, then the double balanced mixer circuit 38 receives at another input a 133 MHz. reference oscillator signal from a 133 MHz. crystal oscillator 39. The double balanced mixer 38 then develops at its output a signal at the frequency of operation of the output of VCO 33 less 133 MHz. The oscillator 39 has a control input on which it may receive a logic level 1 signal indicating operation in the low band. In response to receipt of this control signal the oscillator 39 is disabled. The output of the mixer 38 is applied via low pass filter 41 to a dual modulus frequency divider or pre-scaler 40 which produces at its output a signal at the frequency of the input signal divided by either 15 or 16 dependent on whether a logic level 0 or 1 signal, respectively, is present at a control input thereof. The output of pre-scaler 40 is then applied to the input of a nine-stage variable frequency programmable divider 42. The active double balanced mixer 38 provides rejection of both input frequencies and thus a cleaner waveform at the input to the pre-scaler 40 than otherwise would be provided by a conventional mixer configuration. The pre-scaler then operates in a more reliable fashion, especially for low band frequencies. Divider 42 is actually a nine-shape binary counter which counts to the sum of 512 minus the modulus "M" set on nine inputs; an output thereof changes state when the counter reaches its terminal count. The output of variable frequency divider 42 is applied to a load input of that divider and to a first input of a phase comparator 44. The 10.4 MHz. oscillator 23 is used as a source of the reference frequency signal applied to a second input of the phase comparator. An output of that oscillator 23 is first divided by four by a frequency divider circuit 46 and is then applied to a dual modulus frequency divider 47 which produces at its output a signal at the frequency of the input signal divided by either 520 or 624 dependent on whether a logic level 1 or 0 signal, respectively, is present at a control input thereof. The output of divider 47 is applied as the reference frequency signal to the second input of phase comparator 44. The output of phase comparator 44 is passed through a 5 kHz. notch filter 45 and amplifier 48 which is coupled to the tracking input of VCO 32 and VCO 33. The 5 kHz. notch filter 45 has two branches connected in parallel. One branch includes two 7.5K ohm resistors connected in series with a 0.01 micro farad capacitor connected between these resistors and ground. The other branch includes two 0.0047 farad capacitors connected in series with a 3.9K ohm resistor connected therebetween and ground. This 5 kHz. notch filter has been found to improve ultimate audio quieting for frequencies located in the UHF band by 10 dB relative to other synthesized scanners. The output of amplifier 48 is also applied to a low band tracking offset circuit 49 and a high band tracking offset circuit 51. The tracking offset circuits 49 and 51 selectively adjust the level and slope of the tracking voltage so that it may be used to control the reactance of voltage variable reactance elements included in tuned circuits within the L and H band r.f. amplifier 12, so that the tuning of those circuits is made to correspond to the frequency to which the receiver is tuned.

The control input of dual modulus divider 40 is coupled to the terminal count output of a five-stage binary counter 50. The clock input of that counter is coupled to the output of a two input AND gate 52, which gate has one input coupled to the output of divider 40 and another input coupled to the output of counter 50. A load input of counter 50 is coupled to the output of variable frequency divider 42. Counter 50 counts to the sum of twelve plus the modulus "A" set on inputs to the four least significant stages of the counter. Divider 40 and counter 50 are such that the modulus of divider 40 is 15 when the count in counter 50 is less than 12+A and the modulus of divider 40 is 16 when the count in counter 50 is greater than 12+A.

As will be apparent, the modulus inputs to variable frequency divider 42 and counter 50 and the control inputs to the balanced mixer circuit 38 and dual modulus dividers 40 and 47 determine the frequency to which the receiver is tuned at any particular instant. The divisor provided by the combination of frequency dividers 40 and 42 is equal the sum of 8180 minus MT where MT is the modulus applied to the frequency divider 42 and the counter 50. MT is a thirteen bit binary number with the four least significant bits being the modulus A of counter 50 and the nine most significant bits being the modulus M of frequency divider 42.

When the receiver is to be tuned to a frequency in the L band, a logic level 1 signal is applied to the control input of VCO's 32 and 33, causing VCO 33 to be disabled and causing VCO 32 to operate in the 19.2–39.2 MHz. frequency range, a logic level 1 signal is applied to the control input of buffer-mixer circuit 38 causing it to operate as a buffer, and a logic level 1 signal is applied to dual modulus divider 47 so that the reference frequency applied to the second input of phase comparator 44 will be at 5 kHz. The frequencies applied by the buffer amplifier 35 from the L band VCO 32 to the L and H band mixer 14 will then be spaced at 5 kHz. increments and the receiver may be tuned to any of the designated frequencies in the L band by varying the divisor provided by the combination of dual modulus divider 40 and the nine-stage divider 42 between 3840 and 7840 by selection of the proper modulus inputs to variable frequency divider 42 and counter 50 so that MT varies between 4340 and 340.

When the receiver is to be tuned to a frequency in the H band, a logic level 0 signal is applied to VCO's 32 and 33, disabling VCO 32 and causing VCO 33 to operate in the 135.2–163.2 MHz. frequency range, a logic level 0 signal is applied to the control input of buffer-mixer circuit 38 causing it to produce an output signal at the frequency of VCO 33 less 133 MHz., and a logic level 1 signal is applied to dual modulus divider 47 so that the reference frequency applied to the second input of phase comparator 44 will be at 5 kHz. The frequencies applied through the buffer amplifier 35 by the VCO 33 to the L and H band mixer 14 will then be spaced at 5 kHz. increments and the receiver may be tuned to any of the designated frequencies in the H band by varying the divisor provided by the combination of dual modulus divider 40 and the nine-stage divider 42 between 440 and 6040 by selection of the proper modulus inputs to variable frequency divider 42 and counter 50 so that MT varies between 7740 and 2140.

When the receiver is to be tuned to a frequency in the U or T bands, a logic level 0 signal is applied to the control input of the VCO's 32 and 33 causing VCO 33 to operate in the 136.4–167.07 MHz frequency range, a logic level 1 signal is applied to the control input of oscillator circuit 39 causing balanced mixer 38 to produce an output signal at the frequency of VCO 33 less 133 MHz., and a logic level 0 signal is applied to dual modulus divider 47 so that the reference frequency applied to the second input of phase comparator 48 will be at 4.17 kHz. The frequencies applied by the tripler 34 to the U and T band mixer 18 will then be spaced at 25 kHz. increments with the T band offset by 12.5 kHz. and the receiver may be tuned to any of the designated frequencies in the U and T bands by varying the divisor provided by the combination of dual modulus divider 40 and the nine-stage divider 42 between 816 and 8177 by selection of the proper modulus inputs to variable frequency divider 42 and counter 50 so that MT varies between 7364 and 3. Appropriate control signals are also applied to the L and H band radio frequency amplifier and mixer 12 and 14 according to the band to which the receiver is to be tuned.

A buffer decoder circuit 60 is provided to control the operation of the receiver as thus far described. Buffer decoder 60 has 15 outputs, four of which are labeled A in FIG. 1a and are connected to the modulus inputs of counter 50, nine of which are labeled M and are connected to the modulus inputs of variable frequency divider 42, and two of which are labeled $\overline{H}$ and U/T. The $\overline{H}$ output is at logic level 0 when the receiver is tuned to a frequency in the H band, the U/T output is at logic level 0 when the receiver is tuned to a frequency in the U or T bands, and both are otherwise at logic level 1. The circuit 60 additionally has 15 data input/output lines.

The fifteen data input/output lines of circuit 60 are coupled to the fifteen parallel data output/input lines of a fifteen-stage shift register 68. The shift register includes a serial data input D and is such that the data presented to the serial data input D is stepped into the shift register by application of successive pulses to a clock input C1 and placed on the parallel data output lines. Information will be read into the shift register 68 from input/output D and decoded by the buffer decoder 60 into the four bit "A" modulus, the nine bit "M" modulus, and the band indicator bits U/T and $\overline{H}$. Clock and Data are coupled to terminals C1 and D, respectively, and each of these terminals is coupled to a correspondingly labeled terminal in FIG. 1b.

The RF portion of the circuit included within individual blocks of FIG. 1 as heretofore described does not of itself form a part of this invention and, except for the notch filter 45 and the priority mute circuit 31, may take a variety of forms as will be apparent to those of ordinary skill in the art. Examples of radio receivers including circuitry for providing functions similar to those accorded to the previously described blocks, exclusive of the noted exceptions, may be found in the aforementioned U.S. Pat. Nos. 3,961,261, 3,962,644, 3,987,400 and 4,027,251, 4,100,492, 4,114,103 and 4,123,715. Thus, the detailed circuitry to be included within the blocks of FIG. 1, except for the notch filter 45, and the priority mute circuit 31 will not be further discussed herein.

Figure 1B:
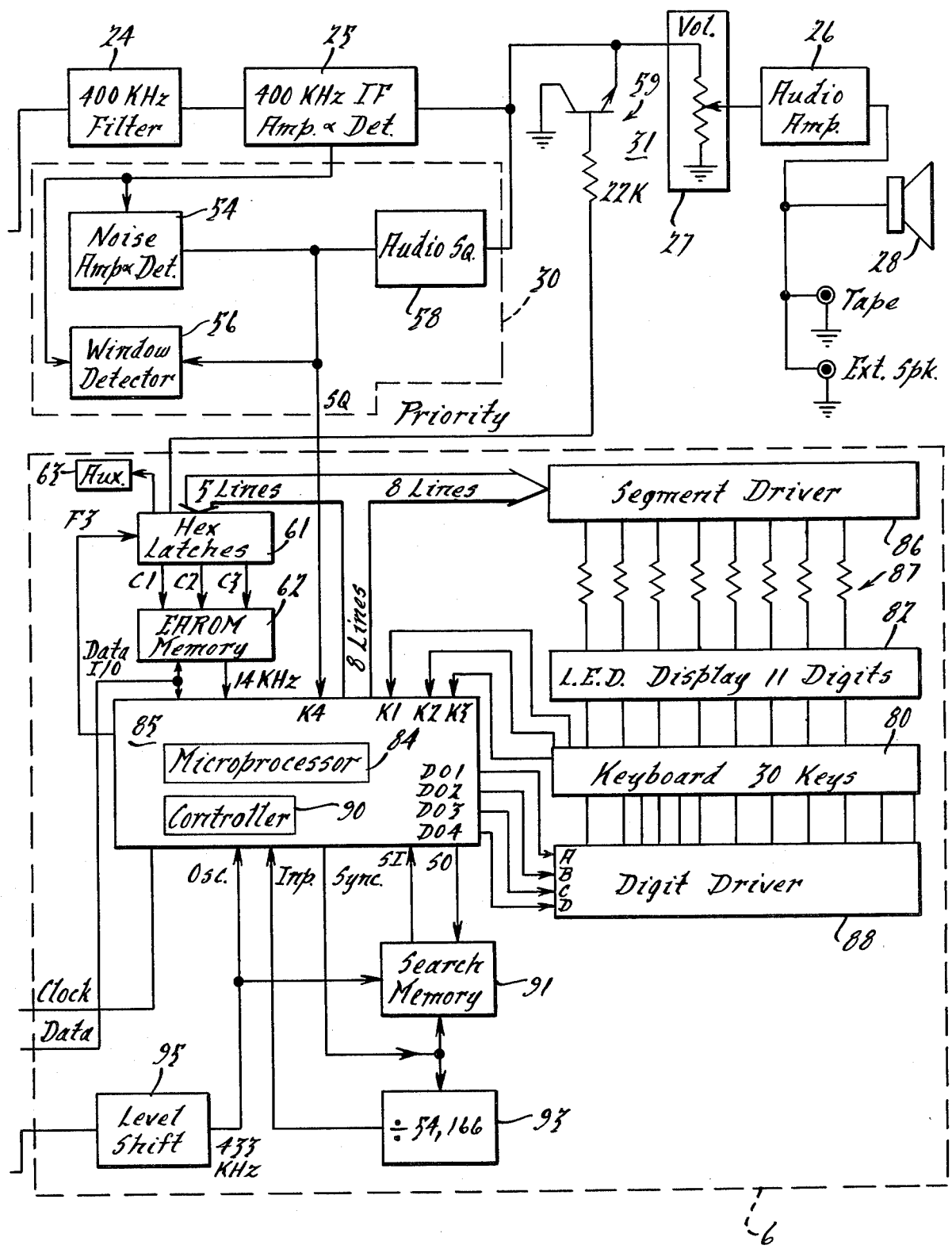

In FIG. 1b and FIG. 2 there is disclosed the circuitry for controlling the operation of the receiver as thus far described with reference to FIG. 1a. That control circuitry includes in general terms a keyboard 80 enabling the user to enter either frequency information or information concerning the modes of operation of the receiver, an eleven digit display 82 which displays to the user information concerning the status of features selected for various operational modes of the receiver, the frequency information being entered and/or an indication of the identity of the channel to which the receiver is tuned. An essential element of the control circuitry is a processor 85 for appropriately processing the information entered by the user and generating the signals required to operate the receiver circuitry of FIGS. 1a and 1b and the display 82, two sets of drivers 86 and 88 interfacing the processor 85 and the display 82, and control inferface logic circuitry 90 for interfacing processor 84 and the receiver circuitry of FIG. 1. Keyboard 80 includes thirty separately operable, normally open switches labeled 0-9, 10, 20, 30, 40, 50, ./AUX (decimal point/auxiliary), SC (scan), E (enter), DY (delay), L (lockout), MA (manual), LM (limit), ↑ (search up), ↓ (search down), ST (store), RE (recall), TI (time), CT (count), SP (speed), and PR (priority). There is disclosed in FIG. 4 one arrangement of the keyboard 80 which has been found very convenient to operate. The circuitry of FIG. 2 will first be described by reference to the various operating modes it provides.

The first operating mode is the "manual" mode. It is entered by temporarily closing switch MA and thereafter each time it is closed again the receiver is caused to successively step through all fifty channels in order and back to channel 1. Successive MAN. key closures cause the receiver to sequence through the channels in order without regard to the banks selected or the lockout status of individual channels. A particular channel may be directly accessed in a "manual" operating mode by the user entering, via the keyboard 80, the decimal number (1 through 50) of the desired channel prior to the MAN. key closure. If a number greater than 50 is entered and then followed by a MAN. key closure, the processor 84 will determine that an invalid keyboard entry has been made and will cause an "Error" message to be shown in the display 82. There is shown on display 82 (FIG. 2c and FIG. 4) in the second and third most significant digit positions a one or two digit number showing the number of the receiver channel currently operating and in the first through sixth least significant digit positions a five or six digit number showing the radio frequency corresponding to that channel. Additional information relating to the status of selective rescan delay and channel lockout are shown in the fourth and fifth digit positions, respectively, of the display 82, for each channel that is manually accessed during the "manual" mode of operation.

The user may determine the frequency assigned to the receiver channel currently operating by entering the frequency in MHz. through keyboard 80. As the frequency is entered, it is shown on display 82. Upon closure of the first numeric key of the keyboard the processor blanks the six right most digit positions of the display and enters the number corresponding thereto to be entered. As additional numbers are entered the previously entered numbers are shifted from right to left in the display. To prevent the user from inadvertently entering more than six digits the processor ignores any digits after six digits are entered. If desired, the user may enter as few as three digits of the frequency number for frequencies in the high or UHF bands. When entering a frequency in the low band the user must enter a decimal point following the second digit. When entry is completed, the user momentarily closes switch E. If at least three but fewer than six numerical digits of a frequency were entered when the user presses the "E" key, the processor will interpret the frequency number to be a high or UHF frequency and automatically enter the decimal point in the appropriate position and fill the remaining unprogrammed digits with zeroes. Similarly, the processor will fill in the remaining unprogrammed digits of a low band frequency number with zeroes, provided a decimal point was entered following the second digit. The processor first checks the entered frequency to determine whether it is within the tuning range of the receiver, i.e., whether it is within the L, H, U or T bands as defined above. If not, an "Error" message is displayed on display 82. If so, the processor converts the entered frequency information into the binary signals required to tune the receiver to that frequency which signals are then read into the selected word of the electronically alterable read only (EAROM) memory 62 and the shift register 68, the receiver is tuned to that frequency, and the contents of the selected word is then read out of the memory back into the processor and reconverted to frequency information and displayed so that the user may verify that the receiver is actually tuned to the frequency he had intended.

The second operating mode is the "scan" mode and is entered by temporarily closing switch SC. The receiver then automatically steps successively and repetitively through the channels until it comes to one on which a signal is being received that is above the receiver squelch level. It then remains on that channel until the signal terminates at which time it resumes scanning until a signal above the receiver squelch level is again received.

The fifty memory channels are organized into five banks of ten memory channels per bank. Five separate bank select keys labeled "10", "20", "30", "40" and "50" are provided on keyboard 80 for the user to select a desired one, all five or any combination of channel banks to be active during the scan mode of operation of the receiver. Each channel bank key operates as a toggle switch whereby the 10 channels associated therewith are included or excluded from the scan mode on alternate key closures. The status of bank selection is indicated by the five indicator dots shown in the upper left corner of the first five digit positions of the display 82. The indicator dot in the first digit position coresponds to the selection of bank "10" which results in channels 1-10 being included in the scan sequence. The remaining four bank indicator dots in the second through fifth digit positions correspond, respectively, to memory channel banks "20", "30", "40", and "50". The bank select keys are operable during all modes of receiver operation. While the receiver is in the scan mode, only the bank indicator dot corresponding to the current bank of channels through which the receiver is scanning, will appear in the display. Notwithstanding this, channel memory bank selection and de-selection may be accomplished as previously described. Should the user press a bank select key other than the key corresponding to the current bank, while the receiver is in the scan mode, the indication of the bank selection change will await the scan operation proceeding to the affected bank. De-selecting a current bank during the presence of a signal on the current channel being monitored results in the receiver skipping to the next selected bank in the scan sequence. De-selecting all banks causes the processor to automatically select bank "10" corresponding to channels 1-10. This prevents the user from inadvertently removing all fifty channels from the scan operation.

Display 82 is also used to give the user a clear indication of the receiver channel that is operative at any instant during the scan mode. To this end, each of the second through eleventh digit positions in the display 82 is made to correspond to a particular one of the ten channels in the current bank and whenever the receiver is set to that channel, the display 82 will display a particular character or characters in the corresponding digit position. In the receiver here described, the digit position second from the left corresponds to the first channel in the current bank with successive digit positions toward the right corresponding to successively higher numbered channels and the digit position furthest to the right corresponding to the highest channel in the current bank. Either the character "O" or "L" is displayed at each digit position depending on whether its corresponding channel is active or has been locked out. Thus, as the receiver successively scans the ten channels in the current bank the "O" and "L" characters appear to travel or roll across the display and at any instant it indicates to the user the channel that is being scanned at that time and its lock-out status. It will be readily apparent that the same character need not be used for each digit. For example, it might be found desirable for the digit corresponding to channel 1 to display the character 1, the digit corresponding to channel 2 to display the character 2, and so on with the digit corresponding to channel 10 displaying the character "O". In this case the character would still appear to travel or roll across the display and it would also change to correspond to the channel number. In some cases it might be found desirable to cause a digit to be displayed in every digit position except that corresponding to the presently operative channel or to cause a digit to be displayed in the digit position corresponding to the presently operative channel and all digit positions to the left or right thereof. In the receiver described, when the receiver reaches a channel at which a signal above the squelch level is received and it stops scanning, the display of the traveling or rolling "O" is terminated and display is then used to show the same information as is present in the manual mode, i.e., a one or two digit number showing the channel number followed by a five or six digit number showing the frequency to which the receiver is tuned.

It sometimes occurs that on the single frequency of one or more channels a two or more way conversation is being had and there will be a slight delay between the termination of the signal carrying one part of the conversation and the commencement of the signal carrying the next part. The user may then desire that there be a slight pause or delay between the termination of the signal and the commencement of the scanning operation. In this case, the user need merely temporarily close switch DY when the receiver is set to the desired channel (either in the manual or scan modes) and the processor will impose such a selective rescan delay on the channel. The delay may be removed by temporarily closing switch DY again when the receiver is set to that same channel. It will be observed that the delay may be selectively imposed only on those channels the user desires. In the receiver described, the presence or absence of the delay is indicated on the display 82 by the presence or absence of a character at the fourth digit position from the left, which character is in the lower case "d".

During operation in the scan mode it may be desirable to lock out one or more channels, i.e., to prevent the receiver from scanning one or more channels. In this case, the user need merely temporarily close switch L when the receiver is set to the channel he desires to lock out (either in the manual or scan modes) and that channel will then be skipped during the scanning process. To remove the lockout, the user need merely step or directly access the receiver to the locked out channel while in the manual mode and temporarily close switch L. The presence or absence of the channel lockout function in the disclosed receiver is indicated by the presence or absence of a character in the fifth most significant digit position which is disposed between the digits representing the channel number and digits representing the frequency. In this receiver, the character used is an "L" being the two left vertical and bottom horizontal bars of the seven segment character display. Further, an "L" on display 82 corresponding to a channel which has been locked out is illuminated instead of the "O" in the scan mode so that the user will be continually reminded which channels are locked out. The receiver enters the scan mode automatically whenever the power is initially applied to it.

During operation in the scanning mode the receiver of the present invention maintains a continually updated tabulation, or count, uniquely associated with each of the fifty scan channels, of the number of times that a signal above squelch has been received on each channel. The user may manually select or directly access any desired channel and then press the COUNT key to close the "CT" switch. The processor responds to this key closure to blank the frequency shown in the six digit positions at the extreme right side of the display and cause a two digit number from 00 to 99 to be shown. This two digit count number represents the number of times that a transmission has been received and detected on that channel since the current frequency was entered on the channel or since the last time that the count code uniquely associated with that channel had been cleared. Thus, a user readily may determine which are the most active of the fifty frequencies being scanned. The count, uniquely associated with a channel on which a count currently is being displayed, may be cleared by the user temporarily closing the "." switch via the decimal point "./AUX" key.

The third operating mode is the "search" mode. In this mode, while the receiver is set to any single channel it may sample all of the designated frequencies occurring between a designated upper frequency limit and a designated lower frequency limit stopping whenever it arrives at a frequency at which there is a signal above the receiver squelch level. To enter the search mode, the user first places the receiver in the manual mode and advances the receiver to the channel on which he desires the search to occur. He then enters the upper or lower frequency limit of the frequency range he wishes to search on keyboard 80, temporarily closes the corresponding "LM" limit switch, enters the remaining frequency limit, and again temporarily closes the "LM" limit switch. The frequency limits are displayed as they are being entered. When the LM limit switch is closed, the processor checks the frequency just entered to see if it is within the tuning range of the receiver, i.e., within the L, H, U or T bands as defined above and, if not, display 82 is made to show the message "Error" indicating to the user that he has made an error. To commence the search, the user temporarily closes one of the " ↑ " or " ↓ " key switches, which transfers the processor to the search mode of operation. The processor then checks to determine if both upper and lower limits were entered and both the upper and lower frequency limits entered are in the H band, the L band, or the U or T bands and, if not, display 82 is made to show the message "Error" again indicating to the user that he has made an error. The processor also then determines which limit is the higher frequency limit and which is the lower frequency limit. Following such actuation of the " ↑ " key, the receiver searches all the designated frequencies within the selected range in an ascending order, starting with the lower frequency limit up to the higher frequency limit and then returning to the lower frequency and repeating the process. Actuation of the " ↓ " key causes the receiver to initiate the search operation from the higher frequency limit in descending order down to the lower limit frequency and then returning to the higher frequency limit and repeating the search operation. In the L band, the receiver is successively tuned to every frequency within the selected range occurring at multiples of 10 KHz. In the H band, the receiver is successively tuned to frequencies at multiples of 5 kHz. In the U and T bands, the receiver is successively tuned to every frequency within the selected range occurring at intervals of 25 kHz, with T band frequencies offset by 12.5 kHz. If desired, the user may reverse the direction of the search operation merely by pressing the " ↑ " or " ↓ " key corresponding to the opposite direction of the current search operation. Whenever the receiver is tuned to a frequency at which there is a desired signal above the squelch level, the receiver will stop scanning, remaining tuned to that frequency and provide an audio output in accordance with the received signal until the signal terminates at which time it will resume scanning.

If desired, the user may include the delay function previously described in the search mode by merely temporarily closing switch DY via the DELAY key of the keyboard 80. In the search mode a "d" symbol will be displayed while the rescan delay is operating as previously described. However, the delay status of the memory location corresponding to the current memory channel will not be altered. The user also may restart the searching process whenever the receiver stops and remains on the frequency to which it is then tuned by temporarily closing one of the " ↑ " or " ↓ " keys which causes the receiver to step from that frequency to the next frequency in the designated sequence. The user monitoring the search operation may also enter any frequency to which the receiver is tuned into the receiver to become the frequency for the channel to which the receiver is then set by temporarily closing the switch "E". If desired, on any other selected channel, the user may resume searching in the desired direction between the same previously entered frequency limits merely by pressing the " ↑ " or the " ↓ " key.

A significant aspect of the present invention is that the controller is adapted to lockout undesired frequencies or "birdies" during the search mode. Should the receiver stop or hang up when a signal or noise above the squelch level is received on the current frequency during the search mode, a user may lock out that frequency by temporarily closing the "L" switch via the "LOCKOUT" key of the keyboard. This causes the processor to resume the search operation and to skip the locked out frequency in subsequent cycles of the search operation. In the preferred embodiment of the present invention as many as 64 frequencies may be locked out of the search operation.

A fourth mode of operation is the "store/recall" mode which may be entered from either the "manual" or "search" mode. This "store/recall" mode is preceded by the user programming search limits in the same manner as previously described for the "search" mode. The user then temporarily closes the "ST" switch via the "STORE" key of the keyboard 80 to commence the store operation. The processor responds to this switch closure to search all valid frequencies within the search limits and automatically stores in a store memory each frequency on which a signal above the receiver squelch level is detected. The processor causes the search immediately to resume whether or not the detected signal has terminated or to resume after a 2-second delay if the delay function has been selected. This process may continue unattended by the user. The processor causes frequencies which have been stored in the store memory to be omitted or skipped during subsequent search cycles. In the preferred embodiment of the present invention, as many as 64 frequencies found to be active may be automatically stored in memory for later recall by the user. Frequencies automatically stored in memory during the store operation may be sequentially retrieved by the processor and displayed, in the same order that they were stored, by successive momentary closures of the "RE" switch via the "RECALL" key of the keyboard 80. The processor blanks the display after the last frequency has been retrieved from the store memory to indicate to the user that all automatically stored frequencies have been recalled. The store memory is not erased or otherwise affected by this recall operation. Therefore, the list of automatically stored frequencies again may be recalled by further repetitive closures of the RECALL key.

Should the user desire to replace the frequency in the channel on which the "store/recall" mode is operational with a current recalled frequency, he presses the "E" enter key of the keyboard. If desired the user may manually proceed to another channel and continue the recall procedure as previously described.

An individual frequency currently being recalled may be erased from the list of automatically stored frequencies by sequentially closing the decimal point "." and "RE" switches. To erase the entire list of automatically stored frequencies the user sequentially closes the decimal point "." and "ST" switches.

During operation of the receiver in any one of the "scan", "search" or "store/recall" modes the user may select one of two different frequency sample speeds by actuating the "SPEED" key of the keyboard. This key controls the "SP" switch which operates as a toggle switch. In the preferred embodiment, the slower frequency sampling rate is 5 frequencies per second and the faster rate is 15 frequencies per second. The speed chosen clearly is indicated by the speed of movement of the rolling symbols during the "scan" mode and by the speed that the frequency number is updated in the display during the "search" and "store/recall" modes of operation.

A fifth mode of operation is the "priority" mode. The "priority" mode of operation is provided in response to actuation of the "PRIORITY" key of the keyboard while the receiver is turned on. Like the other functional keys of the keyboard the "PRIORITY" key operates a toggle action switch "PR". Alternate actuations of the "PRIORITY" key activate and deactivate the "priority" mode. When the "priority" mode is active, the receiver periodically is tuned to a single channel which is preprogrammed to be the only priority channel. In the preferred embodiment of the present invention the first memory channel is fixed as the "priority" channel. This fixed priority channel configuration avoids possible user confusion regarding which channel is the priority channel. Also, it obviates special programming of one or more priority channels. Rather, the user merely selects or deselects the priority mode. The first memory channel is sampled once every two seconds whether the sample speed of receiver scan or search is 5 or 15 channels per second and no matter what is the current mode of operation of the receiver. Thus, when the priority function is active the processor interrupts the normal mode of operation whether it be scan, search, store or recall to output the channel 1 data word to the synthesizer to tune the receiver to the corresponding channel 1 frequency. If a signal is present on that frequency at that sample time the receiver will remain tuned to that frequency for the duration of the signal. If there is no signal present on the priority frequency at the priority sample time, then the microprocessor will return the receiver to the mode of operation prior to the priority interruption.

A sixth mode of operation is the "time" mode. In this "time" mode the processor is programmed to provide a continuous time of day clock display in the six digit positions on the far right side that ordinarily are employed to display the five or six digit frequency number. The "time" mode may be selected by temporarily closing the "TI" switch via the key labeled "TIME". If the "time" mode is selected while the receiver is operating in the "scan", "search" or "store/recall" modes the current channel number, along with the remaining channel and receiver status information will be displayed as previously described with the time display appearing in place of the frequency number. If the receiver power has been interrupted, the processor causes an "E" symbol to appear in the display when the "time" mode is selected thereby indicating that the clock needs to be set. In order to set the clock, the user presses the "MANUAL" and "TIME" keys in sequence thereby closing their corresponding switches "MA" and "TI". This places the processor in the "clock set" moade of operation. Then the user enters in sequence a two digit number via the numeric keys for the appropriate hour, minute and second setting. The time is subsequently entered and the clock commences running upon actuation of the "E" key of the keyboard. If only the hour and minutes, or only the hour, has been set, then the processor starts the clock running at zero (0.00) seconds, or zero (0.00) minutes and seconds, respectively, upon actuation of the enter key. Thus the clock may be conveniently synchronized with a time standard. When the receiver is turned off, the processor automatically enters the "time" mode which results in a continuous time display. However, the user may de-select the automatic time mode by actuating the "TIME" key whereby the display then is completely blanked.

It will thus be seen that the receiver of this invention may be used to continuously search any number of frequencies within a user selected frequency band. This is particularly advantageous where one particular range of frequencies is assigned to a particular class of service such as the 45 channel band for marine communications in the range of 156.275–157.425 MHz. or the 2 meter amateur radio band in the range of 146.000–148.000 MHz. It is also advantageous when a user is attempting to make a systematic effort to determine the identity of frequencies used in his geographic location. He can select his own compromise between using a large frequency range and searching a large number of frequencies relatively rapidly but taking the risk of missing some active frequencies due to the intermittent nature of the signals thereon, or using a smaller frequency range and taking longer to search the large number of frequencies but having a higher probability that no active frequencies will be missed. It will also be seen that if the user desires to find and retain more than one active frequency in a selected band, it is easy for him to do so. He need merely start the search operation on one channel until he finds a frequency he desires to retain, press the "E" enter key and then close switch M one or more times to advance the receiver to the next or any other channel or manually access any other channel directly. The frequency which he found will then be retained as the frequency for the channel on which the search was performed. Further, he may resume the search operation on the new channel using, if he so desires, the previously selected upper and lower search limits. The efficiency of this search operation is enhanced by the capability of the receiver of the present invention to skip and lockout spurious noise frequencies called "birdies" during the search operation.

The automatic search mode, which is also called the "store/recall" mode makes the search operation particularly convenient since the user does not need to continually monitor the search operation to find unknown frequencies. Instead, frequencies located during this mode are automatically stored to be recalled whenever the user desires.

The "Count" mode enables the user to determine which are the most active of the scanned channels so that he can reprogram relatively inactive channels with new frequencies.

It also will be seen that the organization of the fifty scan channels into 5 individually selectable banks of 10 channels per bank greatly increases the versatility of the scanning operation. It also enables the user to program particular banks for certain public service frequencies. For example, the user could program bank 10 with police frequencies, bank 20 with fire frequencies, bank 30 with mobile telephone frequencies, bank 40 with marine frequencies and bank 50 with miscellaneous frequencies. Then any one or combination of banks may be selected or deselected merely by the user closing or toggling corresponding bank keys or switches.

Turning now to the details of the receiver control section 6 of FIG. 1b and FIGS. 2a, 2b, and 2c, the microprocessor 84 is manufactured and sold by National Semiconductor Corporation, Santa Clara, Calif., under the model number COPS MM 5782, which operates in conjunction with a controller chip manufactured and sold by National Semiconductor under model number COPS MM 57129, as described in the National Semiconductor MM 5781/MM 5782 Controller Oriented Processor programming manual dated November, 1977. The microprocessor and controller chips combined are referred to herein as a microprocessor controller 85. The microprocessor controller 85 has three general purpose I/O lines F1, F2, and F3, keyboard return inputs $k_1$, $K_2$, $k_3$ and $k_4$, digit outputs D01–D04, a bidirectional Data I/O line and eight segment outputs SA–SG and SP. The D01–D04 outputs of the logic microprocessor controller 85 are fed in parallel to a set of AND gates 89 in the digit driver 88. These AND gates 89 decode the D01–D04 digit output of microprocessor controller 85. Each of the segment outputs SA–SG and SP is coupled to the base of one of the eight driver transistors 86. The collectors of each one of the driver transistors 86 are coupled together and to a positive potential source and to circuit ground through a series resistor capacitor circuit. The emitter of each one of the driver transistors 86 is coupled to the corresponding segment anode input A–G and DP of display 82. The output from each of the AND logic gates 89 outputs is coupled to the base of one of the twelve digit driver transistors 92. The emitter of each of driver transistors 92 is coupled to circuit ground. The collector of eleven of the digit driver transistors 92 is coupled to the corresponding digit cathode input 9–19 of display 82. Display 82 is an 11 digit display manufactured by Texas Instruments, Inc. under TI part number TMS 1007 with each digit comprised of seven segments puls a decimal point segment and the illumination for each segment being provided by a light emitting diode. The anodes of the segment A diodes of each of the 11 digits are coupled to anode A input of the display, and the anodes for segments B–G and the decimal point are similarly coupled to anode inputs B–G and DP of the display. The anodes of the diodes for each of the segments are coupled to the segments A through G and DP inputs of the display, and the cathodes of each of the diodes for the digits 1–11 are similarly coupled to cathode inputs of the display. The microprocessor controller 85 input $k_1$ is coupled to one side of switches 0, 1, 2, 3, 4, 5, 6, 7, 8 and 9 of keyboard 80, input $k_2$ is coupled to one side of switches ., 10, 20, 30, 40, 50, LM, PR, DY and L, and input $k_3$ is coupled to one side of switches E, RE, MA, SC, ST, SP, TI, ↑, CT, and ↓. The other sides of switches 0, . and E are coupled to cathode input 10 of display 82, of switch 1, 10 and RE to input 11, of switches 2, 20 and MA to input 12, of switches 3, 30 and SC to input 13, of switches 4, 40 and ST to input 14, of switches 5, 50 and SP to input 15, of switches 6, LM and TI to input 16, of switches 7, PR, and ↑ to input 17, of switches 8, DY and CT to input 18, and of switches 9, L and ↓ to input 19.

Five lines provide certain of the segment outputs and the P output from the microprocessor to a set of hex "D" flip flops 61 which interface the microprocessor controller 85 with an electronically alterable read only memory EAROM 62 which in turn communicates data with the controller 90. The EAROM 62 also provides SYNTH. DATA to the shift register 68 for use by the frequency synthesizer circuitry of the phase lock loop. SYNTH. CLOCK signals are provided to the shift register 68 directly from the controller 90. The hex "D" flip flop circuit 61 also interfaces the microprocessor controller 85 with the priority mute circuit 31 and an auxiliary tape output circuit 63. The microprocessor controller 85 receives the 433.333 KHz oscillator signal from clock source 94 via a level shift circuit 95.

An auxiliary control signal may be programmed for each of the channels by sequentially pressing the "./AUX" and the "E" ENTER keys of the keyboard 80. This programs the auxiliary bit of the data word associated with that channel. Then when the receiver 2 is in manual, or scan mode of operation and a signal is received on the current channel that also has an auxiliary bit associated with the data word, a positive logic signal is received on input pin 3 of the hex "D" flip flops 61. If the AUX function is programmed for the current channel prior to entering search limits, then AUX is effective for each frequency on which a signal is received during a search operation. The resulting auxiliary control signal output at pin 2 of the hex "D" flip flops is provided via a 4.7K ohm resistor as input to the base of an auxiliary transistor 97 whose emitter is grounded. Its collector output is maintained at +8.4 V until the transistor 97 becomes conductive. The auxiliary transistor 97 is turned on and becomes conductive in response to receipt of the auxiliary control signal. The collector output of the auxiliary transistor 97 is placed at a ground potential when it is turned on. This ground potential is provided via an auxiliary output jack and may be employed to activate and control an external or auxiliary device such as a tape recorder. When the signal on said current channel terminates, the auxiliary D flip flop is returned to its original state, turning the auxiliary transistor 97 off thereby removing the ground at the auxiliary output jack connected to the collector electrode of the auxiliary transistor.

The C1, C2 and C3 control signals provided as output from the hex "D" flip flops 61 control the internal read, write and erase operations of the EAROM 62 as will be explained in further detail.

The search/store memory 91 receives frequency data from the microprocessor controller 85. As explained previously, this frequency data represents frequencies to be locked out when the receiver is operating in the search mode. When the receiver 2 is operating in the automatic search/store mode this frequency data represents frequencies to be recalled later. The search memory 91 also receives on separate inputs the 433.333 KHz oscillator signal and the SYNC. signal output from the microprocessor controller 85 to synchronize the search memory therewith. The SYNC. signal also is fed to a divide by 54,166 divider 93 which in turn provides a reference input back to the microprocessor controller for use in calculating time.

Turning now to the details of the receiver control section 6, the display device comprises an 11 digit display 82 manufactured by Texas Instruments under Texas Instruments part number DIS 1007. The display is also available from Electra Company, a division of Masco Corporation of Indiana, under the Electra part number MC-62201. When the receiver is initially turned on the sequence of rolling zeroes sequentially appear from digit to digit in the display 82 corresponding to the channels of the bank being scanned. The particular digit illuminated in the display during a scanning operation is determined by the logic gates in the decoder and digit driver circuit 88. For example, the first digit in the display 82 is illuminated upon receipt of a low logic signal at pin 9 of the display 82. Pin 9 in turn is connected to the output pin 1 of the decoder and digit driver 88. Thus, when digit 1 is to be illuminated the output from its corresponding logic AND gate 89 assumes a high logic level in response to a positive "D" signal from the D01–D04 digit outputs of the microprocessor 84. The high logic line of this AND gate is fed to the base of its associated transistor 92 which then becomes conductive. When this transistor turns on its collector output is shorted to ground and a low logic level appears on output pin 1 of decoder and digit driver 88. This low logic state is received on input pin number 9 of the display 82. This enables the first digit of the display to be energized in accordance with the segment anode signals a through g and dp that are input to the display 8 via input pins 1 through 8 of the display. The segment anode signals are provided from segment output pins 15 through 21—and on output pin 13 of the processor 85. For example, if the numeral "1" is to appear in the first digit of the display then segment anodes b and c must be energized simultaneously with the digit 1 cathode. This is accomplished by the processor 84 generating a positive voltage on only segment output pins 19 and 20. This in turn causes a positive voltage to be applied at input pins 7 and 8 of the segment driver 86. This positive voltage is applied to the base of the respective segment drive transistors 82. These transistors thus turn on and a high voltage is output from their emitter outputs at pins 3 and 2, respectively. This in turn causes a positive potential to appear across the b and c segment anodes of the LED display 82.

Similarly, the remaining digits in the display 8 are energized sequentially in accordance with the digit output signals A, B, C, and D of the processor 84 on its output pins 25 through 28 along with the appropriate segment outputs a through g and dp from the processor 84 outputs on pins 15 through 21 and 13.

The digit lines that are input to the display also serve as keyboard strobe lines. In order for a user to program a frequency, for example a frequency of 162.55 MHz, the user will sequentially actuate the numeral keys 1, 6, 2, 5, 5 on the keyboard. Thus, as the displayed digit inputs 10 through 19 of the display 82 are sequentially grounded the corresponding input pins 1 through 10 of the keyboard 80 are also sequentially grounded. If the keyboard key is actuated during this strobe operation, this ground signal will be conducted through the closed contacts of the numeral switch corresponding to the actuated key and provided as output on only one of the K1, K2, or K3 keyboard return signs corresponding to the row in which the actuated key lies. Thus, in our example the numeral key 1 is actuated and a low K1 signal output on the top keyboard row simultaneously with the strobing of keyboard column input connected to the other side of the numeral "1" switch. Thus, a low K1 keyboard return signal is provided at the input pin 5 of the controller 90.

The decoder and digit driver circuit 88 includes twelve AND gates employed to decode predetermined unique combinations of A, B, C and D digit output signals appearing on the D01 through D04 digit outputs of the microprocessor 84. The AND gate 202 provides a high logic level signal at its output in response to receipt of a high logic level D signal, along with a low logic level on all other digit outputs. This causes its associated digit driver transistor 92 to conduct as explained before. AND gate 203 similarly is responsive to receipt of a positive A signal along with the complement of all other digit outputs. AND gate 204 provides an output in response to receipt of both an A and a B digit signal, along with the complement of C and D. AND gate 205 is responsive to B, C, A not and D not inputs. AND gate 206 is responsive to A, C, and D inputs and the complement of B. AND gate 207 is responsive to B and D and A not and C not inputs. AND gate 208 is responsive to A and C inputs and B not and D not. AND gate 209 is responsive to A, B and D and C not inputs. AND gate 210 is responsive to A, B and C and D not inputs. AND gate 211 is responsive to A, B, C and D inputs. AND gate 212 is responsive to C and D and A not and B not inputs. The AND gate 213 is responsive to B, C and D and A not inputs. Thus, each AND gate 89 has four inputs and must receive the complement of all remaining digit outputs, along with the positive signal combinations as shown.

The rate of strobing of the digit outputs and the rate of which the strobing is repeated is, of course, sufficiently fast that the combinations of simultaneously illuminated segments of the successively strobed digits on the display 82 will appear to the user as a complete and continuous display of all the digits. The logic circuit 304 of the controller 90 is synchronized with a clock generator 404 in the processor chip 84. The logic circuit 304 decodes the keyboard return signals input. The controller 90 in turn stores the decoded keyboard information in an appropriate register 316, 308 or 310 in the control chip 90. The remaining numerical keys of the keyboard 80 that have been actuated are similarly decoded by the logic circuit 304 in the control chip 90 in accordance with the synchronization of the receipt of keyboard decode input signals. Then the numeral 1 will be displayed in the digit 11 position of the display 82 which is the extreme right hand digit. This number will be shifted one digit position to the left upon each subsequent numeral keyboard entry. The processor 84 is programmed to automatically enter the decimal point in the appropriate position in the frequency number for frequencies in the high U or T bands. Only for the low band frequencies must the decimal point be manually entered via the keyboard 80. Once the entire frequency is entered via the keyboard 80 that appears in the display 82, a frequency may be entered into the particular channel on which the receiver is stopped at that time merely by the user actuating the "E" enter key of the keyboard 80. Then as keyboard column number 1 is strobed while the "E" enter key is being actuated a low keyboard row output signal K3 will be generated. This K3 signal will be received as an operational command via controller chip 90. The frequency information data along with the operational or functional command is output from the controller chip 90 in a time multiplied fashion on pin 11 of the controller via a data line to the I/O buffer 604 in the EAROM 62. This data is also fed to the synthesizer chip via control board output terminal 5 at the SYNTH. DATA output signal. The I/O buffer 604 is in turn connected via RAM address 606 and RAM address decode circuitry 608 to a RAM memory 610 that is organized as 50 words of 28 bits per word. The particular word of the RAM memory 610 that is addressed with this freshly entered frequency data will be updated and read out under control of a mode decode logic circuit 612 which receives control signals C1, C2 and C3 on input pins 7, 8 and 9 of the EAROM 62. The C1, C2, and C3 signals are provided from the a, b and c segment output of the microprocessor 84 via the hex "D" flip flops 61. The C1, C2 and C3 signals are decoded by the mode decode logic circuitry 612 to provide output to the I/O buffer 604 and "READ", "WRITE", and "ERASE" commands to the RAM memory 610 whereby the various operational modes previously described may be controlled. To insure that the data is stored in the correct location in the EAROM memory 610 the data line is initially provided with the predetermined address of the memory corresponding to the current channel. There is a unique address associated with each of the 50 scanner channels. A SYNTH. CLOCK signal is output on pin 6 of the control board in order to synchronize the data output to the synthesizer board and to maintain the data in the proper order from the most significant bit to the least significant bit. This SYNTH. DATA and SYNTH. CLOCK information is fed to the RF board (FIG. 1a) simultaneously and in a synchronized fashion.

The READ input to the EAROM memory 610 is enabled in order to merely output the frequency code already contained in a particular channel location in the memory then being addressed. When it is desired to change the frequency; and/or data in a particular channel location in the memory, then the WRITE input to the EAROM memory is enabled again via the mode decode logic 612. The ERASE input to the memory 610 is used to clear a frequency code and/or its associated data in a particular channel location of the memory. the SYNTH. DATA and SYNTH. CLOCK signal are provided as input to the shift register 68 and the RF portion of the circuitry (FIG. 1a) to control the frequency synthesizer output from the VCO 32 and 33. The VCO 32 and 33 determine the frequency on which the receiver is tuned. If a signal is present on the tuned frequency, the squelch circuitry on the RF portion of the receiver provides a logic 0 squelch signal. This signal designated K4 is provided via squelch input on pin 8 of the controller chip 90. The controller 90 responds to the zero logic state squelch signal K4 indicative of the presence of a signal on the tuned frequency to stop the scanning or search operation for the duration of the squelch signal. When the signal received on the tuned frequency terminates, the squelch signal goes high. The logic circuitry 304 of the controller chip 90 responds to the squelch signal received at pin 8 going high to resume the scan or search operation. This sequence will be continued while the receiver is in the scan or search mode of operation.

the controller section 6 is centered around a uniquely programmed read-only-memory designated as ROM 318 which is included in the controller 90. The ROM 318 contains 4096 instruction words of eight bits per word and is employed to store the program which controls the operation of the receiver 2. A twelve (12) bit wide address register 316 is used to address particular locations of instruction words to be read out in sequence to the micro-instruction decode circuit 406 of the micro-processor 84. The ROM address register 316 is adapted to increment by one address location on each cycle of the processor unless the instruction at the current address is decoded by instruction decode logic 304 as a transfer of control instruction, such as a call to subroutine.

Two save registers 308 and 310 of the controller 90 provide a two deep stack for storing subroutine return addresses. When the 8 bit instruction is interpreted by the decoder 304 to be a subroutine call instruction, the contents of ROM address register are transferred parallel to the first address save register 308. Similarly, the contents of the first save register are transferred downward to the second save register 310. The address of the subroutine to which control is to be transferred is loaded from ROM 318 to address register 316 and sequencing of ROM address register 316 recommences from the loaded subroutine address. When an instruction is decoded to be a return from subroutine instruction, the decode logic 304 causes a reverse parallel transfer from the lower save register 310 to the save register 308 and in turn to the address register 316. This address location number is then incremented by one. This process enables a set of instructions to be implemented out of sequence with a subsequent return to the original sequence.

The microprocessor 84 also includes a random access memory RAM 410 which contains 640 memory cells software organized as ten sixteen-digit groups with four bits per digit. The RAM 410 functions to hold numerical and control data entered from the keyboard 80, along with intermediate and final results of calculations, status information, and various other working data. The RAM 410 is addressed by a RAM address register 412.

Numerical data and other information is operated upon in the system by a four bit parallel binary adder 414 coupled to the RAM 410 and an accumulator 416. A carry circuit 418 is coupled between the four bit adder 414 and the P output of the microprocessor 84. The accumulator 416 also is connected to a temporary register 420 which functions as a temporary working register.

Clock signals are generated by an internal clock within the processor 84 that is independent of line voltage. A 433.333 KHz clock signal is obtained by dividing down the 10.4 MHz output of oscillator 23 (FIG. 1a). This clock signal is provided as input to the base of level shift transistor 96 which shapes the clock signal into an oscillator signal for receipt by the clock generator 404 of the processor 84 and the logic circuit 304 of the controller 90. The clock generator 404 divides this oscillator signal by 4 which results in the SYNC. signal provided as a 108.33325 KHz signal output from the processor 84. This 108.333 KHz signal is then divided by 54, 167 in divider 93 resulting in a 2 Hz signal. This 2 Hz signal is received at the logic unit 304 via input pin 14 of the controller 90. Under software control, the logic unit 304 is responsive to a transition from a low to high state of the 2 Hz signal to increment a counter disposed in RAM 410. This counter is employed for generating various timing and clock signals. Since this 2 Hz signal is derived from a crystal oscillator, the time of day clock accuracy is maintained even when the receiver is operated from a battery supply and also is independent of variations in line voltage and frequency.

The hexadecimal code included in the ROM 318 essential to implement the receiver modes of operation and functions described above is set forth in Table I as follows:

TABLE I

ROM CODE ASSEMBLY

```
A0000 0000  0 7000  7 7025 14 25FA 32
A0004 1E5E 34 0A0E 22 7F8A 40 D3D9 38
A0008 D431 21 5F14 25 304C 19 1339 16
A0012 139F 28 257A 34 244F 25 D16E 34
A0016 3398 26 7AD4 34 04D4 21 925C 2A
A0020 C12D  3 1F41 21 4807 10 1364 10
A0024 9230 14 0113  5 1D44 22 1335 12
A0028 2031  6 6F4A 36 5FC0 32 0E45 23
A0032 1300  4 3000  3 4F1C 32 4100  5
A0036 130D 23 13F2 21 130E 18 4640 14
A0040 4213 10 1FC0 28 A940 21 4718 20
A0044 4846 25 DD49 39 4113  9 4A6E 32
A0048 4208 14 4742 17 745C 28 446E 28
A0052 2547 18 130D 23 EA13 28 4006 10
A0056 42D2 21 30EA 27 ED37 37 5C46 27
A0060 1320  6 0678 21 1708 10 3106 10
A0064 1300  4 0200  2 3030  6 5100  6
A0068 6307 10 F231 21 406E 37 5700 12
A0072 0707 14 4C31 20 5F45 29 6E5C 37
A0076 3141  9 0647 17 13E9 27 20DC 27
A0080 5936 25 2000  2 1307 11 F209 26
A0084 0646 16 6DCC 43 4708 19 1347 15
A0088 0945 18 1313  8 4977 27 4342 13
A0092 5E40 23 4659 24 306E 23 C06E 32
A0096 1300  4 49C0 25 447C 27 4F6F 40
A0100 1305  9 2578 25 13DD 30 4392 18
A0104 4950 18 3113  8 135C 21 067C 25
A0108 E413 22 EE08 36 1301  5 138A 22
A0112 4213 10 7C06 25 43E4 25 6D49 32
A0116 4930 16 1320  6 3708 18 0650 11
A0120 357A 25 4674 21 3240  9 F401 20
A0124 E66C 38 50E6 25 D946 32 CFA5 42
A0128 1300  4 1300  4 EA36 33 1300  4
A0132 6F30 26 1313  8 5C08 25 0000  0
A0136 4650 15 3113  8 3007 10 0949 22
A0140 2013  6 5F06 26 516D 25 3100  4
A0144 4137 15 0640 10 5040  9 3156 15
A0148 4907 20 F431 23 507D 25 C046 22
A0152 06C0  8 4506 15 1300  4 1C3D 29
A0156 5450 27 0048 12 0000  0 0000  0
A0160 1340  8 1361 11 0714 12 64A9 29
A0164 0911 11 035C 20 014A 28 1640 11
A0168 0607 13 5A23 18 500A 13 1324 10
A0172 5F4F 39 8245 22 3131  8 336C 24
A0176 485F 35 5EC0 31 3130  7 4644 18
```

| | | | | | | | |
|---|---|---|---|---|---|---|---|
| A0180 | 065F | 26 | 0327 | 12 | 31C0 | 16 | 437F | 29 |
| A01A4 | 06U4 | 10 | 20ED | 29 | F630 | 24 | 5113 | 10 |
| A01A8 | 5F11 | 22 | 1000 | 1 | 2525 | 14 | 1C47 | 24 |
| A01A2 | 1300 | 4 | 0940 | 13 | 06FB | 29 | 006A | 16 |
| A01A6 | 07E9 | 30 | 5F5F | 40 | 545A | 25 | 66C0 | 24 |
| A0200 | 31F6 | 25 | 605F | 39 | DD40 | 30 | EA40 | 28 |
| A0204 | 5FC5 | 37 | 6CC4 | 34 | D35F | 36 | CB6B | 40 |
| A0208 | 2020 | 10 | 6B44 | 25 | 6AFC | 43 | EC53 | 34 |
| A0212 | 455F | 29 | 5F69 | 35 | 5FC0 | 32 | CD6B | 39 |
| A0216 | 5740 | 16 | 6A6B | 33 | ECFE | 55 | 696C | 33 |
| A0220 | 5FC0 | 32 | 69C0 | 27 | 5F5D | 38 | 5FC7 | 39 |
| A0224 | 1C00 | 13 | 4100 | 5 | 13D2 | 19 | 4500 | 9 |
| A0228 | D24B | 30 | 1361 | 11 | 418A | 23 | 1300 | 4 |
| A0232 | 0113 | 11 | CA42 | 28 | 4F7F | 41 | 7F47 | 33 |
| A0236 | 1313 | 8 | 7048 | 19 | 7092 | 18 | 1300 | 4 |
| A0240 | 8247 | 21 | 4AE9 | 37 | 6F9F | 45 | 9242 | 17 |
| A0244 | 4E9C | 33 | 7F7F | 44 | 50A9 | 24 | 6F4E | 39 |
| A0248 | DE13 | 31 | 44CE | 34 | 707F | 29 | 64C0 | 22 |
| A0252 | 4F0B | 43 | 6D00 | 19 | CE74 | 37 | 0000 | 0 |
| A0256 | 0E00 | 14 | D200 | 15 | 6100 | 7 | A900 | 19 |
| A0260 | A4A9 | 24 | 445F | 28 | D444 | 25 | 0900 | 9 |
| A0264 | E18A | 33 | 135B | 20 | 1F84 | 28 | 1306 | 10 |
| A0268 | 4701 | 18 | 3106 | 23 | 31D1 | 18 | E200 | 16 |
| A0272 | 4613 | 14 | 07A5 | 22 | 06C4 | 22 | D606 | 25 |
| A0276 | C457 | 20 | A940 | 23 | D209 | 24 | 0E79 | 30 |
| A0280 | 412A | 17 | 2A47 | 23 | 0804 | 18 | 0E46 | 24 |
| A0284 | 0006 | 12 | 004A | 14 | 5F61 | 27 | D200 | 15 |
| A0288 | 4500 | 9 | E600 | 22 | 4620 | 12 | 6100 | 7 |
| A0292 | 0E87 | 25 | 48D2 | 27 | D100 | 14 | 5000 | 5 |
| A0296 | 6FA8 | 34 | EE13 | 32 | 4100 | 5 | 0061 | 7 |
| A0300 | 4500 | 9 | 4300 | 7 | 404F | 23 | 0F00 | 21 |
| A0304 | 0B47 | 28 | 57D2 | 27 | 4645 | 19 | 0082 | 10 |
| A0308 | 1306 | 10 | 0000 | 0 | 0055 | 10 | 01C0 | 19 |
| A0312 | C600 | 18 | D700 | 20 | 0900 | 9 | DDD2 | 41 |
| A0316 | 134E | 22 | 00E4 | 18 | 9200 | 11 | 0000 | 0 |
| A0320 | 4500 | 9 | 6700 | 13 | 706A | 23 | 4700 | 11 |
| A0324 | 4401 | 15 | 1306 | 21 | CA4A | 36 | A000 | 10 |
| A0328 | 13D7 | 19 | 065F | 32 | E200 | 16 | 6192 | 18 |
| A0332 | 4604 | 20 | D74F | 39 | E7D9 | 43 | D700 | 20 |
| A0336 | F04C | 19 | A961 | 26 | D240 | 19 | 6792 | 24 |
| A0340 | 442C | 22 | 00D2 | 15 | 5913 | 16 | 134C | 20 |
| A0344 | 0E0A | 30 | 4548 | 21 | A500 | 15 | 4E44 | 26 |
| A0348 | 80EF | 37 | 0046 | 10 | 4E00 | 18 | 0000 | 0 |
| A0352 | 1F00 | 16 | 4700 | 11 | 4170 | 12 | F400 | 19 |
| A0356 | 1373 | 14 | 4544 | 17 | 4668 | 27 | F8C0 | 35 |
| A0360 | D241 | 20 | 6F4F | 40 | D28C | 35 | 7C13 | 23 |
| A0364 | 4EFF | 48 | 4692 | 21 | 2813 | 14 | 006D | 19 |
| A0368 | 44F3 | 26 | 1313 | 8 | ECD2 | 41 | 6A13 | 20 |
| A0372 | 4673 | 20 | 3CA9 | 34 | 0EDD | 40 | 4000 | 4 |
| A0376 | 1305 | 9 | 0E46 | 24 | 0E70 | 21 | 0082 | 10 |
| A0380 | 2046 | 18 | 7000 | 7 | D771 | 28 | DBA9 | 43 |
| A0384 | 45E1 | 24 | 4C8A | 34 | 8207 | 17 | 4799 | 29 |
| A0388 | 414A | 24 | 9217 | 19 | 4178 | 20 | 9967 | 31 |
| A0392 | 13E1 | 19 | 0049 | 13 | 8C44 | 28 | 4709 | 20 |
| A0396 | 131F | 20 | 4944 | 21 | 6745 | 22 | 1393 | 16 |
| A0400 | D861 | 2A | 92E8 | 33 | 631A | 20 | 671C | 26 |
| A0404 | A913 | 23 | FAE1 | 40 | 8492 | 23 | D916 | 29 |
| A0408 | D213 | 19 | 8D40 | 25 | 9FE1 | 39 | 0F13 | 25 |
| A0412 | 035A | 16 | 4856 | 23 | 8D9E | 44 | 9213 | 15 |
| A0416 | 0700 | 7 | 6D00 | 19 | 47EA | 35 | 41E7 | 26 |
| A0420 | D806 | 27 | 4847 | 23 | 13D2 | 19 | E6A0 | 30 |
| A0424 | 464C | 26 | 0527 | 20 | 9F4A | 38 | 134E | 22 |
| A0428 | 9246 | 21 | 2501 | 14 | 32CE | 31 | FB5A | 41 |
| A0432 | 6EED | 41 | 134A | 18 | 2A13 | 16 | 1313 | 8 |
| A0436 | 139C | 19 | 134E | 22 | E730 | 24 | 0813 | 12 |
| A0440 | A422 | 18 | 2541 | 12 | 134F | 23 | 32F6 | 26 |
| A0444 | 3050 | 6 | 066C | 24 | 3251 | 11 | 0007 | 7 |
| A0448 | 0E00 | 14 | 4400 | 8 | 1392 | 15 | 4900 | 13 |
| A0452 | EDE9 | 50 | 704E | 25 | 0E30 | 17 | 6600 | 12 |
| A0456 | 604A | 34 | FB51 | 32 | 66D1 | 26 | 3213 | 9 |

| | | | | | | | |
|---|---|---|---|---|---|---|---|
| A0460 | 7209 | 18 | 547A | 26 | 1323 | 9 | D700 | 20 |
| A0464 | 4545 | 18 | 464C | 26 | 0770 | 14 | 3206 | 11 |
| A0468 | 1370 | 11 | 1368 | 18 | 30EA | 27 | A1C6 | 29 |
| A0472 | F90B | 38 | F8EB | 51 | 0642 | 12 | 0713 | 11 |
| A0476 | C00E | 26 | 4F92 | 30 | 44A0 | 18 | 0000 | 0 |
| A0480 | 2300 | 5 | 7F00 | 22 | 7F13 | 26 | 6800 | 14 |
| A0484 | 7800 | 15 | 20D4 | 19 | A100 | 11 | 6100 | 7 |
| A0488 | 1313 | 8 | 0000 | 0 | 3000 | 3 | 005C | 17 |
| A0492 | 0300 | 3 | 0000 | 0 | 8A00 | 18 | 5400 | 9 |
| A0496 | A17F | 33 | 735C | 27 | 0032 | 15 | 00D2 | 15 |
| A0500 | 7800 | 15 | 0000 | 0 | 0000 | 0 | 0068 | 14 |
| A0504 | 7F07 | 35 | C500 | 17 | 0000 | 0 | 0000 | 0 |
| A0508 | 9900 | 27 | 0000 | 0 | 4300 | 7 | 0000 | 0 |
| A0512 | 0E00 | 14 | 6D00 | 19 | 4543 | 16 | 5F00 | 20 |
| A0516 | 0E0E | 28 | A019 | 20 | 0601 | 7 | C900 | 21 |
| A0520 | F5A0 | 30 | 138D | 25 | 3261 | 12 | DB06 | 30 |
| A0524 | 0743 | 14 | 4706 | 17 | 4D53 | 25 | 2200 | 4 |
| A0528 | 44ED | 35 | 54EB | 31 | 7913 | 20 | 081A | 19 |
| A0532 | 1640 | 15 | D28A | 33 | 5808 | 24 | 0000 | 0 |
| A0536 | 13DC | 29 | 1801 | 10 | 4CA9 | 35 | 1831 | 16 |
| A0540 | FCE3 | 32 | A530 | 18 | 16EB | 32 | 0000 | 0 |
| A0544 | 0E00 | 14 | 0300 | 3 | 3041 | 8 | 3040 | 7 |
| A0548 | 3CCB | 35 | 0413 | 14 | 0058 | 13 | A4F5 | 34 |
| A0552 | 40F2 | 21 | 310F | 25 | A900 | 19 | 304A | 17 |
| A0556 | 0923 | 16 | 0043 | 7 | 8907 | 24 | 1358 | 17 |
| A0560 | 4402 | 10 | 4202 | 8 | 4340 | 11 | F692 | 32 |
| A0564 | 0730 | 10 | 505B | 21 | 3150 | 9 | 0142 | 7 |
| A0568 | 5613 | 15 | 3C40 | 19 | 5A06 | 22 | 0608 | 14 |
| A0572 | 2579 | 23 | 0101 | 2 | 400B | 12 | 0143 | 8 |
| A0576 | 0F40 | 19 | 1348 | 16 | 4831 | 16 | F18F | 39 |
| A0580 | CE45 | 35 | 70F1 | 23 | E3A9 | 36 | 6613 | 16 |
| A0584 | C400 | 16 | 440E | 22 | 1313 | 8 | 2351 | 11 |
| A0588 | 5FDA | 43 | 0EDA | 37 | 4061 | 11 | FCA1 | 38 |
| A0592 | 4067 | 30 | D451 | 23 | F700 | 28 | A5C0 | 27 |
| A0596 | 310D | 23 | 57A1 | 21 | 924B | 20 | D231 | 19 |
| A0600 | 090F | 21 | 138A | 22 | ED67 | 40 | 4647 | 23 |
| A0604 | 447F | 30 | 994E | 36 | 0803 | 11 | A123 | 16 |
| A0608 | 4000 | 17 | 0858 | 21 | 30CE | 29 | 4066 | 29 |
| A0612 | 7FCE | 48 | 2151 | 9 | 0000 | 0 | 3000 | 3 |
| A0616 | 1331 | 8 | 2151 | 9 | 3E0F | 32 | 0821 | 11 |
| A0620 | 5C06 | 23 | 00D9 | 22 | EF7F | 51 | 6651 | 18 |
| A0624 | F0C4 | 31 | 3058 | 16 | 3125 | 11 | 0321 | 6 |
| A0628 | 3030 | 6 | 25D9 | 29 | 2121 | 6 | 2130 | 7 |
| A0632 | 3021 | 6 | 30F7 | 25 | 5149 | 19 | 064D | 23 |
| A0636 | 0061 | 3 | 1313 | 8 | 1307 | 17 | 0620 | 8 |
| A0640 | 0A00 | 10 | 0040 | 4 | 2209 | 13 | D0DF | 41 |
| A0644 | 2019 | 12 | D409 | 26 | 4040 | 8 | 2008 | 10 |
| A0648 | 0613 | 10 | 5A00 | 15 | 0808 | 16 | 0609 | 15 |
| A0652 | 5939 | 18 | 1A5A | 26 | 1656 | 18 | 0930 | 12 |
| A0656 | 2309 | 14 | 4030 | 7 | 4340 | 11 | F622 | 25 |
| A0660 | 0540 | 9 | EC01 | 27 | 0123 | 6 | 1909 | 19 |
| A0664 | 431A | 18 | 3030 | 6 | DC40 | 29 | 1643 | 14 |
| A0668 | 230A | 15 | 3002 | 5 | 0931 | 13 | 01EC | 27 |
| A0672 | 13D5 | 22 | 4064 | 14 | 4602 | 12 | 2300 | 5 |
| A0676 | F003 | 18 | 4D30 | 20 | 4006 | 10 | A070 | 17 |
| A0680 | 3590 | 17 | 4D5A | 32 | 075F | 27 | 0031 | 4 |
| A0684 | C630 | 21 | 3109 | 13 | 0230 | 5 | 3A71 | 21 |
| A0688 | 43C6 | 25 | 5606 | 17 | 56F9 | 35 | 5723 | 17 |
| A0692 | 0330 | 6 | FA08 | 33 | 025F | 22 | 0243 | 9 |
| A0696 | 4009 | 19 | 40C7 | 23 | C9C7 | 28 | DD56 | 37 |
| A0700 | 300F | 18 | 06EF | 35 | 255D | 25 | DFC7 | 47 |
| A0704 | 0600 | 6 | 4040 | 8 | 4E03 | 21 | 44E6 | 28 |
| A0708 | 1CEF | 42 | A989 | 36 | 0E03 | 17 | 5108 | 14 |
| A0712 | 074F | 20 | 6607 | 19 | 4C31 | 20 | 007F | 22 |
| A0716 | 7043 | 14 | 4013 | 8 | 0018 | 15 | 7031 | 11 |
| A0720 | 5F13 | 24 | A14A | 25 | 130C | 22 | 36E4 | 27 |
| A0724 | 4870 | 19 | 3750 | 15 | 5813 | 17 | FB13 | 30 |
| A0728 | 4413 | 12 | 4031 | 8 | 7031 | 11 | 0540 | 9 |
| A0732 | 0613 | 16 | 4310 | 14 | 6658 | 25 | 0050 | 5 |
| A0736 | 1300 | 4 | 3200 | 5 | 006A | 16 | 0300 | 3 |

| | | | | | | | |
|---|---|---|---|---|---|---|---|
| A0740 | 5BDA | 39 | 00A9 | 19 | 0052 | 7 | 4000 | 4 |
| A0744 | 30E5 | 10 | 445F | 28 | 5113 | 10 | 63CF | 36 |
| A0748 | 545E | 28 | 0347 | 20 | 6130 | 10 | 4400 | 8 |
| A0752 | 58F2 | 30 | 8010 | 9 | 1380 | 12 | 0092 | 11 |
| A0756 | 3046 | 13 | 5EE2 | 35 | 07E1 | 22 | 1303 | 13 |
| A0760 | 30E7 | 24 | 6313 | 13 | F604 | 31 | 6640 | 16 |
| A0764 | 9240 | 15 | 402C | 18 | 1F00 | 16 | 0000 | 0 |
| A0768 | 0F00 | 15 | 0700 | 20 | E113 | 19 | DB00 | 24 |
| A0772 | 47E6 | 31 | 0340 | 13 | 5FD7 | 40 | 4000 | 4 |
| A0776 | 1C33 | 19 | 5EE4 | 37 | 3440 | 11 | DB62 | 32 |
| A0780 | 0806 | 12 | F607 | 28 | 1346 | 14 | 1F00 | 16 |
| A0784 | 2513 | 11 | 400E | 18 | 13C0 | 16 | 1347 | 15 |
| A0788 | 7F06 | 28 | 0061 | 7 | 5FE6 | 40 | EB4B | 40 |
| A0792 | 4D45 | 26 | 475D | 29 | 5F00 | 20 | 13D7 | 24 |
| A0796 | EBC5 | 42 | 0044 | 8 | 4A00 | 14 | 0000 | 0 |
| A0800 | 4700 | 11 | E4E1 | 33 | 464F | 29 | 4780 | 19 |
| A0804 | 4440 | 12 | 724D | 26 | ED40 | 31 | 0167 | 20 |
| A0808 | 13E5 | 23 | 5E62 | 27 | 5E13 | 23 | 454B | 24 |
| A0812 | 4513 | 13 | E201 | 23 | 421F | 22 | 03FC | 30 |
| A0816 | E613 | 24 | 1FE8 | 38 | 1313 | 8 | 1CAC | 35 |
| A0820 | 1350 | 7 | 44ED | 35 | 400E | 18 | 441F | 24 |
| A0824 | 404C | 20 | 4049 | 17 | 3245 | 14 | 46E5 | 29 |
| A0828 | 0E23 | 19 | E5E5 | 38 | 460E | 24 | 4464 | 18 |
| A0832 | 9B00 | 20 | 1C00 | 13 | FC41 | 32 | 4A00 | 14 |
| A0836 | 33E0 | 29 | DC13 | 29 | DC45 | 34 | 7F00 | 22 |
| A0840 | 0FFA | 40 | FD45 | 37 | E5C0 | 31 | EA70 | 31 |
| A0844 | 471C | 24 | 701C | 33 | 3347 | 17 | 1300 | 4 |
| A0848 | 3304 | 10 | 7449 | 24 | 3342 | 12 | 621D | 22 |
| A0852 | 4713 | 15 | 6F6D | 40 | 4413 | 12 | 4F44 | 27 |
| A0856 | E81F | 38 | 49C0 | 25 | 5FCA | 42 | 4542 | 15 |
| A0860 | 4E0E | 32 | 134B | 19 | 7A41 | 22 | 70DC | 32 |
| A0864 | 4C59 | 30 | D862 | 29 | E1F1 | 31 | D192 | 25 |
| A0868 | 4609 | 19 | 4547 | 20 | 47A9 | 30 | 1370 | 11 |
| A0872 | 410E | 19 | F606 | 27 | DE6C | 45 | 1CC7 | 32 |
| A0876 | 1C70 | 20 | F699 | 39 | C713 | 23 | 1F5E | 35 |
| A0880 | 131C | 17 | C7C7 | 38 | 5FDE | 47 | 1336 | 13 |
| A0884 | 4650 | 13 | 0249 | 15 | 70C7 | 26 | 3944 | 20 |
| A0888 | 493A | 26 | 4436 | 17 | 321F | 21 | 9E67 | 36 |
| A0892 | 44DE | 35 | 4992 | 24 | C70E | 33 | 4A13 | 18 |
| A0896 | 1F00 | 16 | 9E00 | 23 | 48A5 | 27 | 9900 | 18 |
| A0900 | E540 | 23 | 40A9 | 23 | 6700 | 13 | 7000 | 7 |
| A0904 | C40A | 34 | DA13 | 27 | 6200 | 8 | 00F1 | 16 |
| A0908 | 9300 | 12 | 0E00 | 14 | 7000 | 7 | 0E00 | 14 |
| A0912 | 4492 | 19 | 8AA9 | 37 | 4513 | 13 | 0092 | 11 |
| A0916 | 9261 | 18 | 0000 | 8 | 004A | 14 | 0046 | 10 |
| A0920 | 1313 | 8 | 4400 | 8 | AC00 | 22 | 6200 | 8 |
| A0924 | 5D45 | 27 | 0040 | 4 | F100 | 16 | 0000 | 0 |
| A0928 | 0000 | 0 | 6500 | 11 | 0040 | 4 | 0000 | 0 |
| A0932 | 400C | 22 | 5A65 | 26 | 7240 | 13 | 6000 | 6 |
| A0936 | C171 | 21 | 00C1 | 13 | 6546 | 21 | 3000 | 3 |
| A0940 | 6540 | 15 | C16B | 27 | 0066 | 12 | 6400 | 10 |
| A0944 | 4063 | 13 | 0065 | 11 | 4000 | 4 | C140 | 17 |
| A0948 | 006F | 21 | FA20 | 27 | 1C63 | 22 | 406D | 23 |
| A0952 | 0067 | 13 | 656B | 28 | 7352 | 17 | 74C1 | 24 |
| A0956 | DE5F | 47 | 1300 | 4 | 0050 | 18 | 0740 | 11 |
| A0960 | 1E00 | 15 | 0300 | 3 | 2531 | 11 | 0000 | 0 |
| A0964 | 1FU8 | 24 | 330B | 16 | 5F40 | 37 | 3100 | 4 |
| A0968 | 0610 | 7 | 070D | 20 | 3F00 | 18 | 000D | 13 |
| A0972 | 4600 | 10 | 2342 | 11 | 095A | 22 | 7F00 | 22 |
| A0976 | 4945 | 22 | 0720 | 9 | 317F | 26 | 4A07 | 21 |
| A0980 | 330E | 20 | 0000 | 0 | 0047 | 11 | 4A40 | 18 |
| A0984 | 2313 | 9 | 3340 | 10 | 2600 | 8 | 030E | 17 |
| A0988 | 363F | 27 | 0042 | 6 | 3300 | 6 | 0000 | 0 |
| A0992 | 6400 | 10 | F000 | 15 | 01FB | 33 | 6100 | 7 |
| A0996 | C470 | 23 | D761 | 27 | EA00 | 22 | E600 | 20 |
| A1000 | 0101 | 14 | 4070 | 11 | 6100 | 7 | 00DA | 23 |
| A1004 | 6100 | 7 | 7900 | 16 | 6100 | 7 | D300 | 16 |
| A1008 | 6101 | 14 | D7E5 | 39 | 7061 | 14 | 000A | 10 |
| A1012 | FC0A | 37 | 0000 | 0 | 0079 | 16 | 0061 | 7 |
| A1016 | C601 | 25 | E200 | 16 | 7900 | 16 | 4000 | 4 |

| | | | | | | | | | |
|---|---|---|---|---|---|---|---|---|---|
| A1020 | F7C0 | 34 | 0000 | 0 | 6100 | 7 | 0000 | 0 | |
| A1024 | 1E00 | 15 | EF00 | 29 | 7703 | 17 | 7300 | 10 | |
| A1028 | 1E3F | 33 | 1E09 | 24 | 1E00 | 15 | 2000 | 2 | |
| A1032 | EF1E | 44 | 7F33 | 28 | 0006 | 29 | 0006 | 0 | |
| A1036 | EF00 | 29 | 0000 | 0 | 5F00 | 20 | EF00 | 29 | |
| A1040 | 7F1E | 37 | 45EF | 38 | 337D | 26 | 0010 | 1 | |
| A1044 | 7846 | 22 | 0000 | 0 | 0000 | 0 | 001E | 15 | |
| A1048 | 7523 | 17 | EF00 | 29 | 0000 | 0 | 0000 | 0 | |
| A1052 | 361E | 25 | 0000 | 0 | 7100 | 8 | 0000 | 0 | |
| A1056 | 1300 | 4 | 3300 | 6 | 14E6 | 25 | 0300 | 16 | |
| A1060 | 13EC | 30 | 4645 | 19 | 33DE | 33 | 3300 | 6 | |
| A1064 | EF00 | 29 | 0344 | 24 | 7C2F | 36 | C3F7 | 37 | |
| A1068 | FBDC | 51 | 33C3 | 16 | 06C3 | 21 | 0000 | 0 | |
| A1072 | 03F7 | 25 | 3300 | 6 | 33F7 | 28 | 33F7 | 28 | |
| A1076 | 330B | 14 | 3308 | 14 | 33F7 | 28 | 0133 | 20 | |
| A1080 | 47D3 | 27 | 33C3 | 21 | C2F7 | 36 | 4033 | 10 | |
| A1084 | 00D3 | 16 | F833 | 27 | 0000 | 0 | 0000 | 0 | |
| A1088 | 1A00 | 11 | 7F00 | 22 | 7FC9 | 43 | 5500 | 10 | |
| A1092 | 7F90 | 40 | CB58 | 36 | 4000 | 17 | 0700 | 7 | |
| A1096 | 7F13 | 26 | 5154 | 15 | 0300 | 3 | 0023 | 5 | |
| A1100 | 0900 | 6 | 4800 | 15 | C9E5 | 40 | A000 | 10 | |
| A1104 | 7F13 | 26 | 0700 | 7 | 4813 | 16 | 0009 | 9 | |
| A1108 | 124C | 19 | 0000 | 0 | 0051 | 6 | 6F1A | 32 | |
| A1112 | 3709 | 19 | 3800 | 9 | 5100 | 7 | 4242 | 20 | |
| A1116 | 5406 | 15 | 0040 | 17 | 5200 | 7 | 0000 | 0 | |
| A1120 | 0A00 | 10 | 4E00 | 18 | 4917 | 21 | 4200 | 6 | |
| A1124 | 7F17 | 30 | 3333 | 12 | 2409 | 15 | 0000 | 0 | |
| A1128 | 7F13 | 26 | 4833 | 18 | 0000 | 0 | 0000 | 4 | |
| A1132 | 1700 | 8 | 0809 | 17 | 130A | 14 | 1300 | 4 | |
| A1136 | 7FFC | 49 | 2433 | 12 | 2417 | 14 | 4000 | 4 | |
| A1140 | C033 | 6 | 0000 | 0 | 00F0 | 15 | 0900 | 9 | |
| A1144 | 334C | 22 | 2400 | 6 | 1300 | 4 | 3309 | 15 | |
| A1148 | 334B | 21 | 0017 | 8 | 3300 | 6 | 0000 | 0 | |
| A1152 | 3300 | 6 | F300 | 18 | 3333 | 12 | 3100 | 4 | |
| A1156 | 0053 | 8 | DE00 | 27 | F700 | 22 | F700 | 22 | |
| A1160 | 0033 | 6 | 4DD1 | 31 | 5100 | 6 | 0031 | 4 | |
| A1164 | 3300 | 6 | F300 | 18 | 3300 | 6 | 3300 | 6 | |
| A1168 | F703 | 25 | F330 | 21 | F733 | 28 | 0031 | 4 | |
| A1172 | F340 | 22 | 0000 | 0 | 0003 | 3 | 00F7 | 22 | |
| A1176 | 3032 | 9 | F700 | 22 | 3300 | 6 | D800 | 21 | |
| A1180 | C900 | 21 | 0000 | 0 | D100 | 14 | 0000 | 0 | |
| A1184 | A000 | 19 | 8000 | 8 | 69CD | 40 | 1300 | 4 | |
| A1188 | 0023 | 5 | 135E | 23 | CDA0 | 35 | 1300 | 4 | |
| A1192 | 8006 | 14 | F420 | 21 | CD13 | 29 | 6306 | 15 | |
| A1196 | 80D5 | 26 | CDD2 | 9 | 0018 | 9 | 1300 | 4 | |
| A1200 | 6900 | 15 | 3021 | 6 | 2223 | 0 | 0E24 | 20 | |
| A1204 | 5ACD | 40 | 4040 | 8 | A913 | 23 | FB25 | 33 | |
| A1208 | 6944 | 23 | 0645 | 15 | 5345 | 17 | 2501 | 14 | |
| A1212 | 5A3A | 30 | 4016 | 11 | CDEC | 51 | 0000 | 0 | |
| A1216 | 1C00 | 13 | B800 | 19 | DAB0 | 27 | 6E00 | 20 | |
| A1220 | 449A | 27 | 0C6E | 32 | A906 | 25 | F600 | 21 | |
| A1224 | 0E0F | 35 | 079A | 26 | 6F4C | 37 | 1311 | 6 | |
| A1228 | 2307 | 12 | 033E | 20 | 4706 | 17 | F700 | 22 | |
| A1232 | 490F | 28 | 6F00 | 21 | 9A33 | 25 | 134A | 18 | |
| A1236 | 889D | 38 | A940 | 23 | EACC | 48 | 646F | 31 | |
| A1240 | 4250 | 16 | F340 | 22 | 9068 | 36 | 9226 | 19 | |
| A1244 | 0F00 | 15 | 6B13 | 16 | 33A9 | 25 | 6DE6 | 39 | |
| A1248 | 9200 | 11 | 0F00 | 15 | 2647 | 19 | 0000 | 0 | |
| A1252 | 640F | 31 | 6D0F | 34 | 6EB4 | 35 | 8800 | 16 | |
| A1256 | 008B | 22 | 6F00 | 21 | 2147 | 14 | 2303 | 8 | |
| A1260 | A900 | 34 | 04F7 | 26 | 6F06 | 27 | B200 | 13 | |
| A1264 | 1342 | 10 | 236B | 26 | 8004 | 12 | 906F | 43 | |
| A1268 | 0F0B | 29 | FD0F | 43 | 646F | 30 | 30A9 | 22 | |
| A1272 | 030E | 23 | 0F9D | 25 | 6D4A | 33 | 3908 | 22 | |
| A1276 | 0039 | 12 | D813 | 25 | 92A0 | 22 | 6C40 | 22 | |
| A1280 | 1F00 | 6 | 6B00 | 17 | 440E | 10 | 3000 | 3 | |
| A1284 | 0E40 | 18 | 025C | 19 | 0300 | 3 | 4000 | 4 | |
| A1288 | 4056 | 15 | 3046 | 19 | 3000 | 6 | 0020 | 2 | |
| A1292 | 3000 | 6 | D400 | 17 | 1300 | 4 | 0700 | 7 | |
| A1296 | 44C0 | 20 | 4A02 | 16 | 1330 | 7 | 0050 | 5 | |

| | | | | | | | | |
|---|---|---|---|---|---|---|---|---|
| A1300 | 0970 | 16 | 0000 | 0 | 0000 | 0 | 0006 | 6 |
| A1304 | 1346 | 14 | 0700 | 7 | 0300 | 3 | 0000 | 0 |
| A1308 | 4006 | 10 | 0000 | 0 | 5800 | 16 | 0000 | 0 |
| A1312 | 1300 | 4 | 3000 | 3 | 0843 | 18 | 0100 | 1 |
| A1316 | 1B00 | 12 | 4301 | 8 | 0600 | 6 | 6A00 | 16 |
| A1320 | 47CE | 37 | 0000 | 0 | 0800 | 8 | 0009 | 9 |
| A1324 | 3100 | 4 | 0000 | 0 | DE00 | 27 | 0600 | 6 |
| A1328 | 4453 | 16 | 5432 | 14 | 0058 | 13 | 0040 | 4 |
| A1332 | 0100 | 1 | 0000 | 0 | 0000 | 0 | 0001 | 1 |
| A1336 | 006A | 16 | CC00 | 24 | 0000 | 0 | 0000 | 0 |
| A1340 | 7606 | 19 | 0000 | 0 | 1900 | 10 | 0000 | 0 |
| A1344 | 1300 | 4 | EE00 | 28 | 4754 | 20 | 4400 | 8 |
| A1348 | 2000 | 2 | DC43 | 32 | 5400 | 9 | 1300 | 4 |
| A1352 | 3013 | 7 | 4322 | 11 | 4700 | 11 | 0009 | 9 |
| A1356 | 4500 | 9 | 3001 | 17 | 0340 | 7 | 2200 | 4 |
| A1360 | 1746 | 18 | F653 | 29 | 0923 | 14 | 0038 | 11 |
| A1364 | 4454 | 17 | 0000 | 0 | 00D3 | 16 | 5300 | 8 |
| A1368 | 5230 | 10 | 1300 | 4 | F600 | 21 | 0E00 | 14 |
| A1372 | FC3A | 38 | 004A | 14 | 2000 | 2 | 0000 | 0 |
| A1376 | 13C4 | 20 | 9207 | 18 | 2301 | 6 | 3240 | 9 |
| A1380 | 7013 | 11 | 3206 | 11 | 3013 | 7 | 5B69 | 28 |
| A1384 | 7013 | 11 | 3041 | 8 | 3070 | 10 | 0731 | 11 |
| A1388 | 7A91 | 23 | CDD2 | 40 | 4354 | 16 | 5754 | 21 |
| A1392 | 66A1 | 23 | 32F9 | 29 | 78F9 | 30 | 66CB | 35 |
| A1396 | 7B20 | 20 | 92C4 | 27 | D509 | 27 | 6900 | 15 |
| A1400 | 13C8 | 25 | 4006 | 10 | 32B2 | 18 | 435E | 26 |
| A1404 | 085B | 22 | A9A9 | 38 | 3013 | 7 | 0706 | 19 |
| A1408 | 0700 | 7 | 4000 | 4 | E149 | 28 | 0900 | 9 |
| A1412 | 4487 | 23 | 08F4 | 27 | 0600 | 6 | 3100 | 4 |
| A1416 | 8F06 | 29 | 3113 | 8 | 6700 | 13 | 0044 | 8 |
| A1420 | 8000 | 14 | CD00 | 25 | 0900 | 9 | 1300 | 4 |
| A1424 | 134B | 16 | 1331 | 8 | 0831 | 12 | 0006 | 6 |
| A1428 | 1307 | 11 | 0000 | 0 | 0000 | 0 | 006F | 23 |
| A1432 | 1306 | 16 | 0700 | 7 | 6A00 | 16 | 0000 | 0 |
| A1436 | 0630 | 9 | 0000 | 0 | 4000 | 4 | 0000 | 0 |
| A1440 | 1300 | 4 | 0200 | 2 | 0900 | 9 | 2A00 | 12 |
| A1444 | 0600 | 6 | 0900 | 9 | 2300 | 5 | 0000 | 0 |
| A1448 | 2300 | 14 | 0000 | 0 | 0900 | 9 | 0000 | 0 |
| A1452 | 4100 | 5 | 0000 | 0 | 0000 | 0 | 0300 | 3 |
| A1456 | 2441 | 11 | 0030 | 3 | 0009 | 9 | 0000 | 0 |
| A1460 | 0900 | 9 | 0000 | 0 | 0000 | 0 | 00C6 | 18 |
| A1464 | 5F00 | 20 | 0000 | 0 | 0000 | 0 | 0000 | 0 |
| A1468 | 004D | 17 | 0000 | 0 | 4000 | 4 | 0000 | 0 |
| A1472 | 1300 | 4 | 4B00 | 15 | 4EA8 | 36 | EB00 | 22 |
| A1476 | 1F58 | 29 | CC45 | 33 | 4540 | 13 | BA00 | 21 |
| A1480 | 73C0 | 22 | 0C43 | 25 | 3345 | 15 | C0A3 | 25 |
| A1484 | 1D45 | 23 | DFCF | 55 | 4333 | 19 | 4600 | 10 |
| A1488 | 4D4B | 37 | A368 | 27 | E58A | 40 | 1308 | 12 |
| A1492 | 3B7D | 34 | FA0E | 39 | EB40 | 29 | FCA8 | 45 |
| A1496 | A944 | 27 | 4740 | 15 | 33C0 | 18 | 3333 | 12 |
| A1500 | A8A8 | 36 | 13FD | 32 | A340 | 30 | 70C8 | 27 |
| A1504 | 1300 | 4 | 4700 | 11 | D445 | 26 | AC00 | 22 |
| A1508 | DD0C | 44 | B33B | 28 | B333 | 20 | D300 | 10 |
| A1512 | 33B3 | 20 | 33AC | 28 | 4400 | 8 | 0013 | 4 |
| A1516 | 4600 | 10 | FCFC | 54 | 46FD | 38 | 5800 | 13 |
| A1520 | 3BB3 | 28 | F845 | 32 | 7DAC | 42 | FDB3 | 42 |
| A1524 | ACCF | 49 | 0000 | 0 | 0033 | 6 | 41C2 | 19 |
| A1528 | AC03 | 30 | 0640 | 10 | 3300 | 6 | DF33 | 34 |
| A1532 | AC0A | 30 | 0033 | 6 | 4300 | 7 | 0000 | 0 |
| A1536 | 1300 | 4 | 1300 | 4 | D006 | 19 | 3000 | 3 |
| A1540 | 2BBE | 32 | C9DB | 42 | 4FC0 | 31 | 5F00 | 20 |
| A1544 | 2600 | 8 | 77DB | 35 | E500 | 19 | 0084 | 15 |
| A1548 | 1300 | 4 | 7767 | 27 | 9A4D | 36 | 5F00 | 20 |
| A1552 | 2516 | 14 | 5153 | 14 | 0A23 | 15 | 00A0 | 10 |
| A1556 | 3278 | 20 | 0000 | 0 | 0078 | 15 | A007 | 17 |
| A1560 | 7000 | 7 | 2200 | 4 | 7900 | 16 | 74A9 | 30 |
| A1564 | 07C5 | 24 | 00B6 | 17 | 0600 | 6 | 0000 | 0 |
| A1568 | 88C0 | 18 | 4057 | 29 | B640 | 34 | 6666 | 24 |
| A1572 | 75FA | 37 | 7586 | 29 | 4574 | 20 | 78A9 | 34 |
| A1576 | 72C0 | 18 | 444D | 25 | 7840 | 19 | A978 | 34 |

| | | | | | | | |
|---|---|---|---|---|---|---|---|
| A1580 | A94D | 36 | 7872 | 24 | 754D | 29 | 757A | 29 |
| A1584 | 79DF | 44 | A074 | 21 | 1DB6 | 31 | 79B6 | 33 |
| A1588 | 70U6 | 26 | 7266 | 21 | EA70 | 31 | A072 | 10 |
| A1592 | 1D90 | 23 | 4D60 | 34 | 88CF | 43 | 7990 | 25 |
| A1596 | 74FE | 40 | 7486 | 28 | 88CF | 43 | 78CF | 42 |
| A1600 | B800 | 16 | 4D00 | 17 | H692 | 28 | FC00 | 27 |
| A1604 | 7906 | 28 | B615 | 23 | E300 | 17 | 7000 | 7 |
| A1608 | 7470 | 18 | 6445 | 19 | 7900 | 16 | 0013 | 4 |
| A1612 | 4400 | 8 | 7000 | 7 | 0677 | 20 | 1600 | 7 |
| A1616 | 79A0 | 26 | 8890 | 28 | C040 | 29 | 0010 | 14 |
| A1620 | 77C0 | 26 | 0000 | 0 | 0075 | 12 | 6771 | 21 |
| A1624 | 1D49 | 33 | FC00 | 27 | 0AC0 | 10 | 75CA | 34 |
| A1628 | 13A0 | 14 | 0079 | 16 | 1300 | 4 | 0000 | 0 |
| A1632 | 1300 | 4 | 16EB | 29 | 13D3 | 20 | A90A | 29 |
| A1636 | A706 | 23 | 1eA2 | 19 | E216 | 23 | A264 | 22 |
| A1640 | 7013 | 11 | 6513 | 15 | 1313 | 8 | BBA2 | 34 |
| A1644 | 4647 | 21 | 5813 | 20 | B61A | 28 | F4A9 | 38 |
| A1648 | 0647 | 17 | A964 | 29 | 0247 | 22 | 46F4 | 29 |
| A1652 | B618 | 22 | 19B6 | 24 | FDFH | 54 | 71A2 | 20 |
| A1656 | DF08 | 38 | EFFD | 57 | B445 | 24 | DHB6 | 41 |
| A1660 | 0A95 | 19 | B6A7 | 34 | EFA9 | 48 | 6540 | 15 |
| A1664 | 1300 | 4 | D000 | 13 | 2816 | 17 | 1300 | 4 |
| A1668 | 2746 | 1A | 1A13 | 15 | A7EC | 43 | 1800 | 12 |
| A1672 | 3006 | 9 | DE1D | 41 | 0600 | 6 | 49DA | 36 |
| A1676 | 74F8 | 34 | 0745 | 16 | 649D | 32 | 0600 | 6 |
| A1680 | 0513 | 9 | 4726 | 19 | 6507 | 18 | 0AA9 | 29 |
| A1684 | 5005 | 10 | 00FB | 23 | 0A9D | 32 | AD5F | 43 |
| A1688 | 26DB | 32 | AD4B | 35 | C000 | 12 | BBCC | 46 |
| A1692 | 9213 | 15 | 009D | 22 | 2600 | 8 | 0000 | 0 |
| A1696 | 3000 | 3 | 2300 | 5 | 3838 | 22 | 4300 | 7 |
| A1700 | 1303 | 11 | E113 | 19 | 0911 | 11 | 2200 | 4 |
| A1704 | 00E3 | 19 | 4009 | 13 | 205A | 17 | 3000 | 3 |
| A1708 | 2000 | 2 | F113 | 20 | 0743 | 14 | 3000 | 3 |
| A1712 | A0E2 | 13 | 2354 | 14 | 5413 | 13 | 2200 | 4 |
| A1716 | 3030 | 6 | 0922 | 13 | 431D | 21 | 585E | 32 |
| A1720 | 0007 | 7 | 385A | 29 | 2030 | 5 | 4603 | 13 |
| A1724 | 2042 | 8 | 2240 | 8 | 405A | 19 | 0740 | 11 |
| A1728 | 0EU0 | 14 | 0600 | 6 | 4011 | 6 | 6C00 | 18 |
| A1732 | 1346 | 14 | 1D13 | 18 | A940 | 23 | 7900 | 16 |
| A1736 | D1A9 | 33 | 131D | 18 | 4000 | 4 | 00F8 | 23 |
| A1740 | 4900 | 13 | 7871 | 23 | 7875 | 27 | 7000 | 7 |
| A1744 | 443E | 25 | 75C0 | 24 | F646 | 31 | 0040 | 4 |
| A1748 | 6C11 | 20 | 0000 | 0 | 00F7 | 22 | 7872 | 24 |
| A1752 | 0771 | 15 | CB00 | 23 | 7000 | 7 | 1370 | 11 |
| A1756 | 7913 | 20 | 0011 | 2 | 1100 | 2 | 0000 | 0 |
| A1760 | A700 | 17 | F900 | 24 | 4679 | 26 | 7300 | 10 |
| A1764 | 1672 | 16 | AB73 | 31 | 1111 | 4 | 1100 | 2 |
| A1768 | 1372 | 13 | 7675 | 25 | 7156 | 19 | 3078 | 15 |
| A1772 | 1309 | 13 | EB13 | 26 | 1343 | 11 | 7700 | 14 |
| A1776 | A947 | 30 | AB70 | 28 | 7966 | 28 | 0275 | 14 |
| A1780 | 71A6 | 29 | 0902 | 11 | 431D | 21 | 5870 | 20 |
| A1784 | DC66 | 37 | E856 | 33 | 0030 | 15 | 4623 | 15 |
| A1788 | DC13 | 29 | 0240 | 6 | 1150 | 13 | 0740 | 11 |
| A1792 | 1D00 | 14 | D800 | 21 | 8045 | 17 | 5B00 | 18 |
| A1796 | 65EA | 36 | 16B1 | 19 | 3013 | 7 | 8100 | 17 |
| A1800 | E113 | 19 | 00E4 | 18 | 071D | 21 | 4003 | 7 |
| A1804 | B850 | 24 | 06DA | 29 | 0343 | 10 | B100 | 12 |
| A1808 | 4505 | 20 | 0300 | 3 | 5850 | 1B | 2657 | 20 |
| A1812 | 26D1 | 22 | 45A9 | 28 | 2302 | 7 | 5946 | 24 |
| A1816 | 9EB1 | 35 | 2316 | 12 | 0A63 | 19 | 56CD | 36 |
| A1820 | 4447 | 19 | C009 | 21 | 0362 | 11 | C000 | 12 |
| A1824 | 1300 | 4 | CB00 | 23 | 46E1 | 25 | 1300 | 4 |
| A1828 | E23B | 30 | A945 | 28 | B800 | 17 | A900 | 19 |
| A1832 | 4706 | 21 | FB00 | 26 | A700 | 17 | 0040 | 4 |
| A1836 | A200 | 12 | 62F9 | 32 | 1AA9 | 30 | 6500 | 11 |
| A1840 | 38BB | 38 | 0A38 | 13 | 4764 | 21 | 0062 | 8 |
| A1844 | FB1A | 37 | 0000 | 0 | 0020 | 2 | 649E | 33 |
| A1848 | A24A | 31 | 0A00 | 10 | A900 | 19 | D413 | 21 |
| A1852 | 07B6 | 24 | 0047 | 17 | A900 | 19 | 0000 | 0 |
| A1856 | 7200 | 9 | 0700 | 7 | 0940 | 26 | 1300 | 4 |

| | | | | | | | |
|---|---|---|---|---|---|---|---|
| A1860 | 0620 | 8 | 2356 | 16 | C851 | 26 | 1600 | 7 |
| A1864 | 1A30 | 14 | 5600 | 11 | 1600 | 7 | 0002 | 2 |
| A1868 | C0DA | 35 | 1331 | 8 | 1AFH | 35 | 5900 | 14 |
| A1872 | 7743 | 21 | F715 | 28 | 0202 | 4 | 0055 | 10 |
| A1876 | 3118 | 13 | 0000 | 0 | 0006 | 6 | 4000 | 4 |
| A1880 | 5B30 | 19 | 5631 | 15 | D400 | 17 | 3018 | 12 |
| A1884 | 3100 | 13 | 0008 | 8 | 3000 | 3 | 0000 | 0 |
| A1888 | 1300 | 4 | 9A00 | 19 | 9ARB | 41 | 0000 | 0 |
| A1892 | C5EE | 45 | 7740 | 18 | 6279 | 24 | 1300 | 4 |
| A1896 | 4670 | 17 | 7045 | 16 | 7400 | 11 | FC80 | 35 |
| A1900 | A97R | 34 | 7177 | 22 | A9FC | 46 | A900 | 19 |
| A1904 | 3807 | 21 | A21A | 23 | 1A70 | 18 | 773B | 28 |
| A1908 | 7573 | 22 | 0000 | 0 | AA76 | 33 | 1A65 | 22 |
| A1912 | 1AA2 | 23 | 7378 | 25 | 7900 | 16 | 7070 | 14 |
| A1916 | B0AA | 37 | 00AA | 20 | B600 | 17 | 0000 | 0 |
| A1920 | 0240 | 11 | 6D00 | 19 | F000 | 15 | 0700 | 7 |
| A1924 | 4600 | 10 | 0000 | 0 | 3100 | 4 | 0000 | 0 |
| A1928 | 2731 | 13 | 0000 | 0 | 5300 | 8 | 0000 | 0 |
| A1932 | 2600 | 8 | 0000 | 0 | 0000 | 0 | 0000 | 0 |
| A1936 | 13C0 | 16 | 0006 | 6 | 0032 | 5 | 0000 | 0 |
| A1940 | 30V0 | 3 | 0000 | 0 | 0000 | 0 | 0000 | 0 |
| A1944 | 1300 | 4 | C200 | 14 | 0000 | 0 | 0000 | 0 |
| A1948 | 0000 | 15 | 0000 | 0 | 5060 | 5 | 0000 | 0 |
| A1952 | C100 | 13 | 6500 | 11 | C140 | 17 | C100 | 13 |
| A1956 | 400C | 22 | 5A65 | 26 | 7240 | 13 | 0000 | 0 |
| A1960 | 0071 | 8 | C100 | 13 | 6500 | 11 | 00C1 | 13 |
| A1964 | 0540 | 15 | 006A | 14 | C166 | 25 | 6400 | 10 |
| A1968 | 4003 | 13 | C165 | 24 | 40C1 | 17 | 0040 | 4 |
| A1972 | C16F | 34 | 0000 | 0 | 0063 | 9 | 406D | 23 |
| A1976 | C107 | 26 | 656B | 28 | 7300 | 10 | 7400 | 11 |
| A1980 | DE5F | 47 | 00C1 | 13 | C100 | 13 | 0000 | 0 |
| A1984 | 6100 | 7 | F000 | 15 | 0306 | 9 | 2500 | 7 |
| A1988 | D0E7 | 34 | 4350 | 12 | 0F4F | 34 | 3000 | 3 |
| A1992 | 6101 | 8 | 5F51 | 26 | 1100 | 2 | 0000 | 0 |
| A1996 | 0140 | 5 | 47F3 | 29 | 3142 | 10 | 4D00 | 17 |
| A2000 | C023 | 17 | 0950 | 14 | 314D | 21 | 4058 | 17 |
| A2004 | C0DC | 31 | 0000 | 0 | 00DD | 26 | 405A | 19 |
| A2008 | 43V0 | 7 | 564B | 26 | 4000 | 4 | 4A46 | 24 |
| A2012 | F050 | 20 | 0040 | 4 | 2500 | 7 | 0000 | 0 |
| A2016 | DC00 | 25 | F700 | 22 | DA7A | 40 | 4000 | 4 |
| A2020 | A906 | 33 | BC65 | 34 | 6767 | 26 | 8600 | 14 |
| A2024 | A776 | 30 | C015 | 18 | 74ED | 38 | F773 | 32 |
| A2028 | 40D2 | 19 | 84B9 | 32 | 0594 | 18 | A240 | 16 |
| A2032 | A5BB | 34 | 2368 | 19 | 809C | 20 | E413 | 22 |
| A2036 | 6BD0 | 27 | 6504 | 21 | 68A1 | 25 | C465 | 27 |
| A2040 | 03AF | 34 | 0568 | 25 | 90ED | 36 | 9BE1 | 32 |
| A2044 | 13C0 | 16 | 0091 | 16 | B120 | 14 | 0706 | 13 |

The code is set forth in the standard form prescribed by National Semiconductor Corporation, Santa Clara, Calif. and described in its publication entitled "MM5781/MM5782 Controller Oriented Processor Programming Manual" dated November, 1977. In Table I, the first column contains the instruction address of the first ROM word printed on that line, the second column is the first object word of the Op code, the third column is a check sum for the first object word, the remaining columns are the remaining object words each immediately followed by its check sum.

Figure 2A:
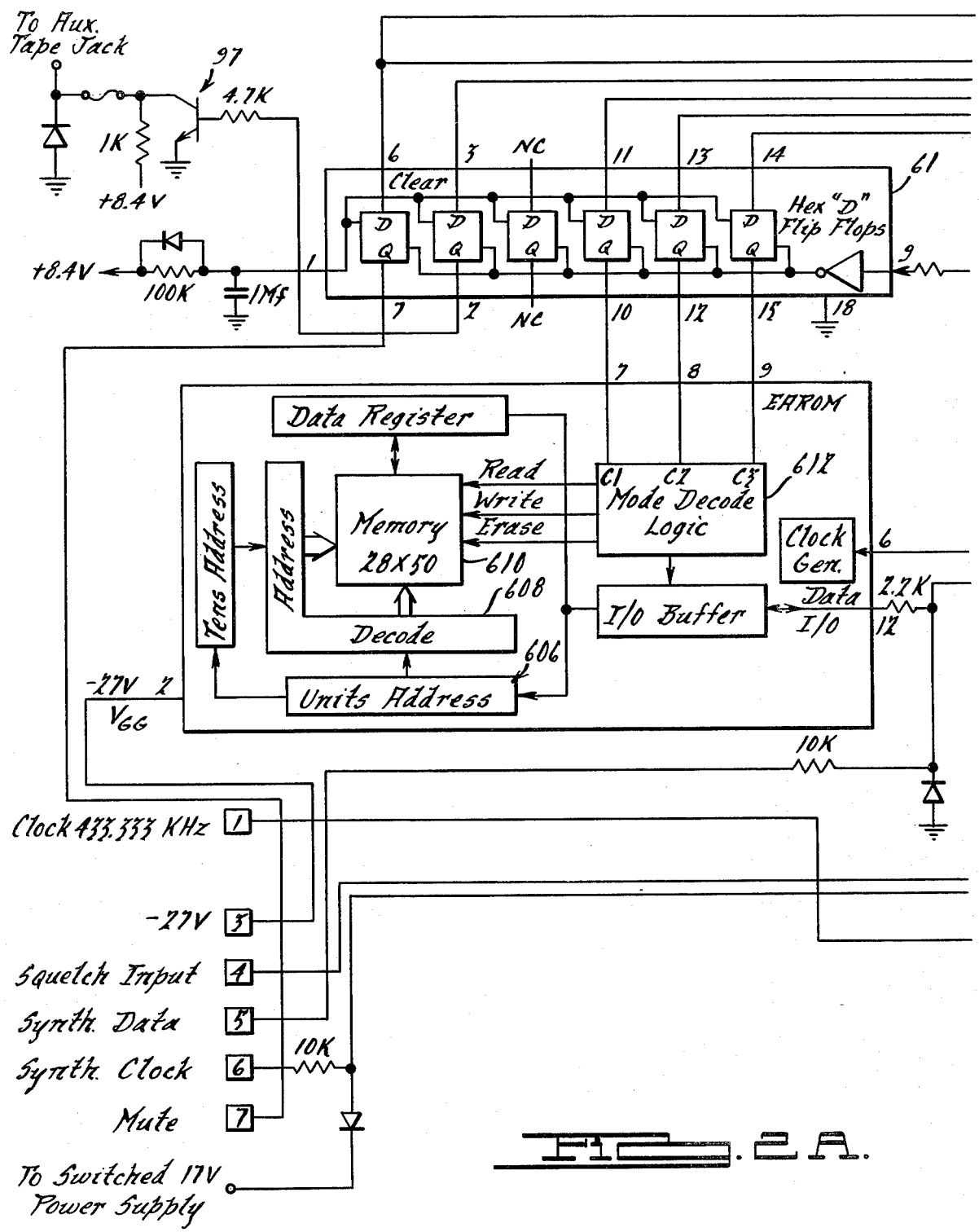
Figure 2B:
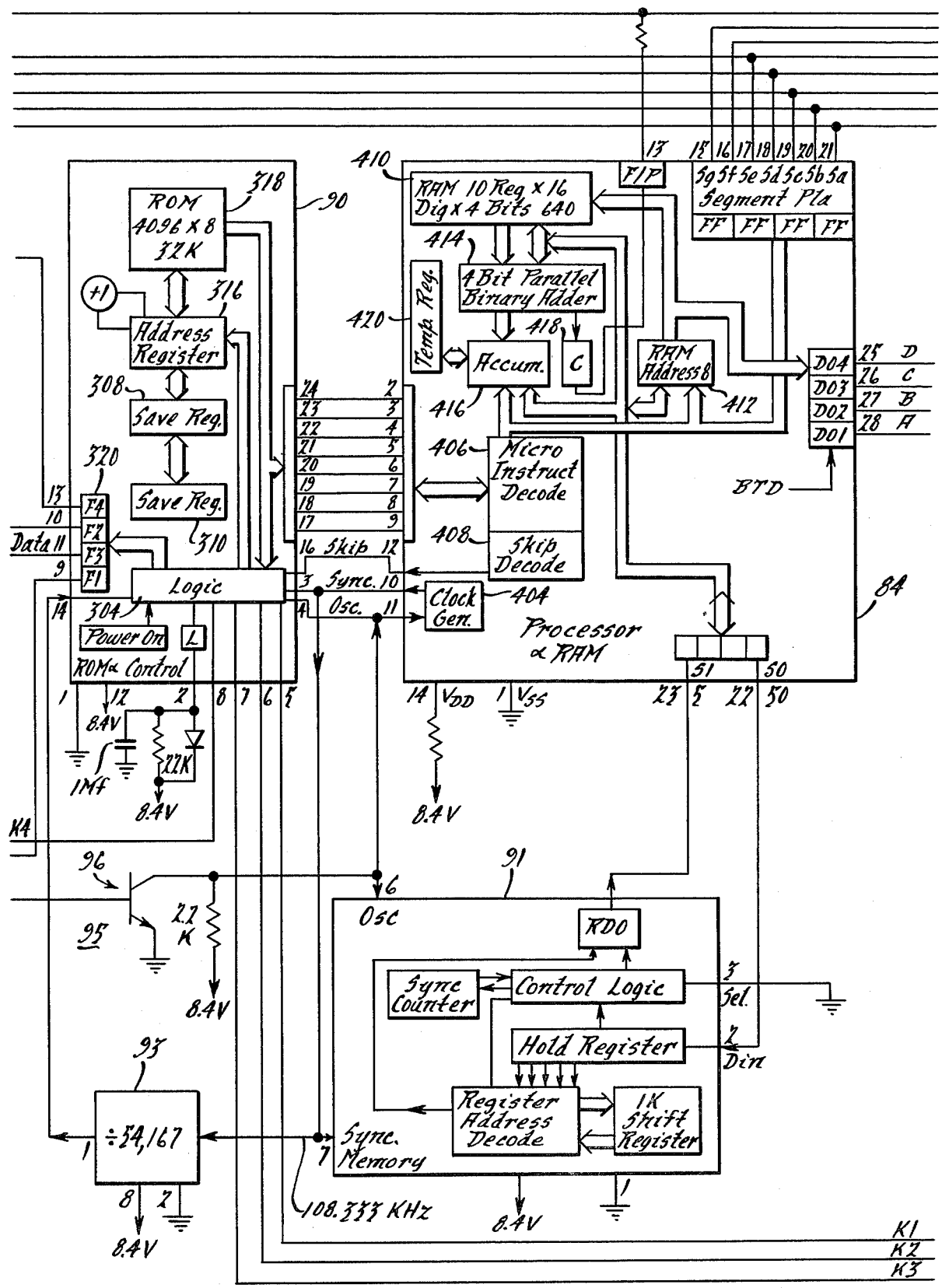

A list of the integrated circuit elements shown in FIGS. 2a, 2b and 2c is set forth in Table II below, including the source of manufacture, the manufacturer or industry designation, and the Electra part number for each of the listed elements.

TABLE II

| Integrated Circuit | Manufacturer/Designation | Electra Part No. |
|---|---|---|
| Hex D Flip Flop 61 | National Semiconductor Corporation, Santa Clara, California/74C174N | NB 85801 |
| EAROM 62 | General Instruments, Inc. Hicksville, Long Island/ ER 1400 | NB 85901 |
| Controller 90 | National Semiconductor/ MM 57168 (57129NDU) | NB 65804 |
| Processor 84 | National Semiconductor/ MM 5782 | NC 73901 |
| Search/Store RAM 91 | National Semiconductor/ MM 57126 | NB 86601 |
| + 54,176 IC 93 | National Semiconductor/ MM 5369 ETD/N | NB 86001 |
| Decoder & Digit Driver 88 | National Semiconductor/ DS 8968N | NB 861001 |
| Segment Driver 86 | National Semiconductor/ DS 8654N | NB 86201 |
| Keyboard 80 | Chomerics, Inc. Woburn, Mass./ KCS 23905-030-1 | BC 62301 |
| Display 82 | Texas Instruments, Inc. Opto Electronics Div. Dallas, Texas/ DIS 1007 | MC 62201 |

The "NDU" ROM code set forth in Table I is employed in the preferred embodiment of the present invention. This code solves performance and reliability problems found in receivers made with previous controller ICs containing various different ROM program codes.

A significant aspect of this control logic of the present invention is that alternative uses of the control section 6 may be accomplished by strap options to accommodate different IF frequencies, expanded or slightly different band coverage, and different RF synthesizer circuitry. This enables a more universal application of the control circuitry of the present receiver. The strap option diode 707 (FIG. 2c) enables the microprocessor controller 85 to interface with the 133 MHz synthesizer currently employed in the preferred embodiment of the present invention. Diode 707 may be removed to enable the microprocessor controller 85 to interface with alternate synthesizer circuitry that requires a different set of frequency data words than the set required by the synthesizer described above. With strap option diode 707 in the circuit a K2 control signal is received on the pin 6 input to the controller 90 when that line is strobed at the appropriate time in the processor cycle. This causes the controller 90 to output data on the data line that is compatible with the synthesizer described herein. With the diode removed the controller 90 will determine that no input is received on pin 6 at the appropriate time in the processor cycle and therefore output in alternate data code compatible with the alternate synthesizer.

A second strap option is made available by the addition of a strap option diode 708 shown in dotted lines between the keyboard and the output pin 18 of the digit driver. This second strap option enables the IF frequency to be changed from 10.8 MHz to 10.85 MHz. The 10.85 MHz IF frequency advantageously may be employed to minimize the problem of the receiver responding to spurious signals commonly called "birdies" which would otherwise interfere with desired frequencies that are prevalent in only certain geographic areas of the country. Of course, when the higher IF frequency is employed it is necessary to change the ceramic filter in the RF section of the receiver 2.

The remaining optional diode 709 in this strap option changes the band limits for at least one of the bands. The microprocessor controller 85 of the present invention has been programmed to expand the lower band which normally is 30 to 50 MHz to cover the additional range of 66 to 88 Mhz with the addition of strap diode 709. Thus, the processor 84 may accept as valid frequency limits frequencies that are inputted via the keyboard 80 in this extended band of frequencies.

It is significant to note that the microprocessor controller 85 for the present invention may be adapted to implement the above described alternative applications merely by the addition of the strap option diodes 707, 708 and 709 without the need to change the microprocessor program itself.

We claim:
1. A scanning radio receiver having a plurality of channels for receiving signals at a plurality of discrete frequencies within at least one radio frequency band and comprising:
  radio signal frequency conversion and demodulation means for producing an audio signal from received radio frequency signals;
  frequency synthesizer means for generating a local oscillator signal for tuning said radio signal frequency conversion and demodulation means and having an input for controlling the frequency of said local oscillator signal;
  squelch circuit means for detecting the presence of a received signal at the frequency to which the receiver is tuned;
  frequency search circuit means coupled to said frequency synthesizer means input and said squelch circuit means for sequentially and automatically stepping the receiver through said discrete frequencies located until the receiver becomes tuned to a radio frequency at which a received signal is present and resuming stepping the receiver through said discrete frequencies when said received signal terminates;
  memory circuit means coupled to said frequency search circuit means for sequentially and automatically storing signals representative of the tuned radio frequencies at which a received signal is present; and
  user selectable means including a recall key operable to an active position by the user, said frequency search means including means coupled to said key and said memory circuit means and arranged to respond to operation of said key to said active position for controllably retrieving from said memory circuit means said stored signals.

2. A scanning radio receiver having a plurality of channels for receiving signals at a plurality of discrete frequencies within at least one radio frequency band and comprising:
  radio signal frequency conversion and demodulation means for producing an audio signal from received radio frequency signals;
  frequency synthesizing means for generating a local oscillator signal for tuning said radio signal frequency conversion and demodulation means and having inputs for controlling the frequency of said local oscillator signal;
  squelch circuit means for detecting the presence of a received signal at the frequency to which the receiver is tuned;
  processor means coupled to said frequency synthesizing means inputs and said squelch circuit means and in a first mode of receiver operation sequentially and automatically stepping the receiver through said plurality of channels until the radio becomes tuned to a radio frequency at which a received signal is present and resuming stepping the receiver through said plurality of channels when said receiver signal terminates; and display means controlled by said processor means, said processor means being arranged to control said display means for providing an indication of the number of occurrences of a signal present at a tuned frequency.

3. A scanning radio receiver having a plurality of channels for receiving signals at a plurality of discrete frequencies within at least one radio frequency band and comprising:
  radio signal frequency conversion and demodulation means for producing an audio signal from received radio frequency signals;
  frequency synthesizing means for generating a local oscillator signal for tuning said radio signal frequency conversion and demodulation means and having inputs for controlling the frequency of said local oscillator signal;
  squelch circuit means for detecting the presence of a received signal at the frequency to which the receiver is tuned;
  memory circuit means for storing a plurality of channel data words each uniquely associated with one of said channels, said memory circuit means adapted to store said data words in a plurality of data banks each containing a plurality of channel data words;
  processor means coupled to said memory circuit means, said squelch circuit means and in a scanning mode of receiver operation sequentially and automatically addressing the plurality of channel data words stored in said memory circuit means and causing said addressed channel data words to be sequentially applied to said frequency synthesizing means inputs for automatically stepping the receiver through said plurality of channels until the radio becomes tuned to a radio frequency at which a received signal is present and resuming stepping the receiver through said plurality of channels when said receiver signal terminates; and
  user selectable means for selecting desired ones of said banks to be included in said memory addressing and for selecting desired ones of said banks to be omitted from said memory addressing.

4. The scanning radio receiver of claim 1 wherein said frequency search circuit means comprises a microprocessor controller coupled to both said memory circuit means and said user selectable means for controlling said sequential and automatic storing and retrieving.

5. The scanning radio receiver of claim 4 wherein said memory circuit means includes a recirculating storage device.

6. The scanning radio receiver of claim 5 wherein said user selectable means includes a keyboard coupled to said microprocessor controller.

7. The scanning radio receiver of claim 6 further comprising display means coupled to said microprocessor controller for displaying an indication of the frequency of said retrieved signals.

8. The scanning radio receiver of claim 5 further comprising a channel scan memory coupled to both said microprocessor controller and said frequency synthesizer for storing a plurality of data words in addressable locations each corresponding to one of a plurality of receiver channels, and said microprocessor adapted to operate in a scan mode to sequentially address said data words and to control sequential application of said data words to said frequency synthesizer means.

9. The scanning radio receiver of claim 8 wherein said user selectable means includes a keyboard containing said recall key and coupled to said microprocessor controller.

10. The scanning radio receiver of claim 9 wherein said keyboard includes a key for automatically entering one of said retrieved signals from said recirculating storage device into one of said addressable locations in said channel scan memory.

11. The scanning radio receiver of claim 10 further comprising display means coupled to said microprocessor to display frequency and status information corresponding to the addressed data word.

12. The scanning radio receiver of claim 9 wherein said microprocessor controller is adapted to operate in a priority mode to periodically sample a preprogrammed one of said address locations out of said scan sequence and for providing to said display means an indication of the priority status of the receiver.

13. The scanning radio receiver of claim 9 wherein said processor is adapted to operate in a search mode to automatically and repetitively step the receiver through said discrete frequencies disposed between user programmable frequency limits until the receiver becomes tuned to a radio frequency at which a received signal is present and resuming the search operation when said received signal terminates.

14. The scanning radio receiver of claim 13 wherein said keyboard includes a key for entering said frequency limits into said microprocessor controller and a key for causing said search operation to proceed toward one of said frequency limits.

15. The scanning radio receiver of claim 11 wherein said microprocessor controller is adapted to operate in a time mode of operation for causing said display to provide a visual time indication.

16. The scanning radio receiver of claim 15 wherein said keyboard includes a key for enabling and for disabling said microprocessor controller from operating in said time mode.

17. The scanning radio receiver of claim 11 wherein said microprocessor controller is adapted to operate in a count mode to display in said display means a count indication of the number of occurrences of a signal at a tuned frequency.

18. The scanning radio receiver of claim 17 wherein said microprocessor controller is adapted to display a unique count indication for each of said data words addressed during said scan operation.

19. The scanning radio receiver of claim 13 wherein said microprocessor controller is adapted to store in said recirculating storage device a list of frequencies to be automatically omitted from said search operation in response to actuation of said keyboard.

20. The scanning radio receiver of claim 9 wherein said keyboard includes a key for causing an auxiliary indication signal to be included in a desired one of said data words, and an auxiliary output circuit including an auxiliary output jack coupled to said microprocessor controller and responsive to said auxiliary indication signal to provide an auxiliary output control signal at said auxiliary output jack wherein the operation of a device remote from said receiver may be controlled.

21. The scanning radio receiver of claim 4 further including means coupled to said microprocessor controller for receiving an insertable strap option diode wherein said microprocessor controller is adapted to operate with an alternate one of two different frequency synthesizer means upon insertion of said strap option diode.

22. The scanning radio receiver of claim 4 further comprising means coupled to said microprocessor controller for receiving an insertable strap option diode wherein said microprocessor controller is adapted to cause said frequency synthesizer means to provide said radio frequency conversion and demodulation means with local oscillator signals compatible with an alternate one of two different radio frequency conversion and demodulation means upon insertion of said strap option diode.

23. The scanning radio-receiver of claim 4 further comprising means coupled to said microprocessor controller for receiving an insertable strap option diode to enable said microprocessor controller to alter the range of operation of said frequency synthesizer means upon insertion of said strap option diode.

* * * * *